United States Patent
Renninger, II

(10) Patent No.: US 6,972,634 B2
(45) Date of Patent: Dec. 6, 2005

(54) INTERCONNECTED MULTI-STAGE OSCILLATOR

(75) Inventor: Robert G. Renninger, II, Changewater, NJ (US)

(73) Assignee: Agere Systems Inc., Allentown, PA (US)

(*) Notice: Subject to any disclaimer, the term of this patent is extended or adjusted under 35 U.S.C. 154(b) by 348 days.

(21) Appl. No.: 10/304,885

(22) Filed: Nov. 26, 2002

(65) Prior Publication Data

US 2005/0128010 A1   Jun. 16, 2005

(51) Int. Cl.[7] ............................................. H03B 27/00
(52) U.S. Cl. ......................... 331/57; 331/45; 331/175; 327/280
(58) Field of Search ........................... 331/57, 45, 175; 327/280

(56) References Cited

U.S. PATENT DOCUMENTS 5,994,939 A * 11/1999 Johnson et al. ............. 327/280
6,756,853 B2 * 6/2004 Schmitt et al. .............. 331/57
6,801,095 B2 * 10/2004 Renninger, II .............. 331/57

* cited by examiner

Primary Examiner—Arnold Kinkead
(74) Attorney, Agent, or Firm—Nancy R. Gamburd

(57) ABSTRACT

The invention provides an oscillator apparatus having a plurality of stages, with each stage of the plurality of stages having an output node, and with a plurality of input transistors within each stage. The various output nodes are coupled to the transistor inputs of the various stages, such that for the $n^{th}$ stage of the plurality of stages, the input to $j^{th}$ transistor, of the plurality of input transistors, is coupled to the $(n-j)^{th}$ output node, and wherein (n–j) is determined modulo N, where "N" is a total number of the plurality of stages and "j" is a transistor number of the plurality of input transistors within each stage. The various embodiments of the oscillator include oscillators with 6 or more stages and with 3 or more inputs per stage, plus any load input transistor, including 8 and 16 stage oscillators to produce a multiplicity of phases for any selected use. The fundamental oscillation mode frequency may also be tuned or varied through the addition of more stages and by varying the size of the transistors.

31 Claims, 20 Drawing Sheets

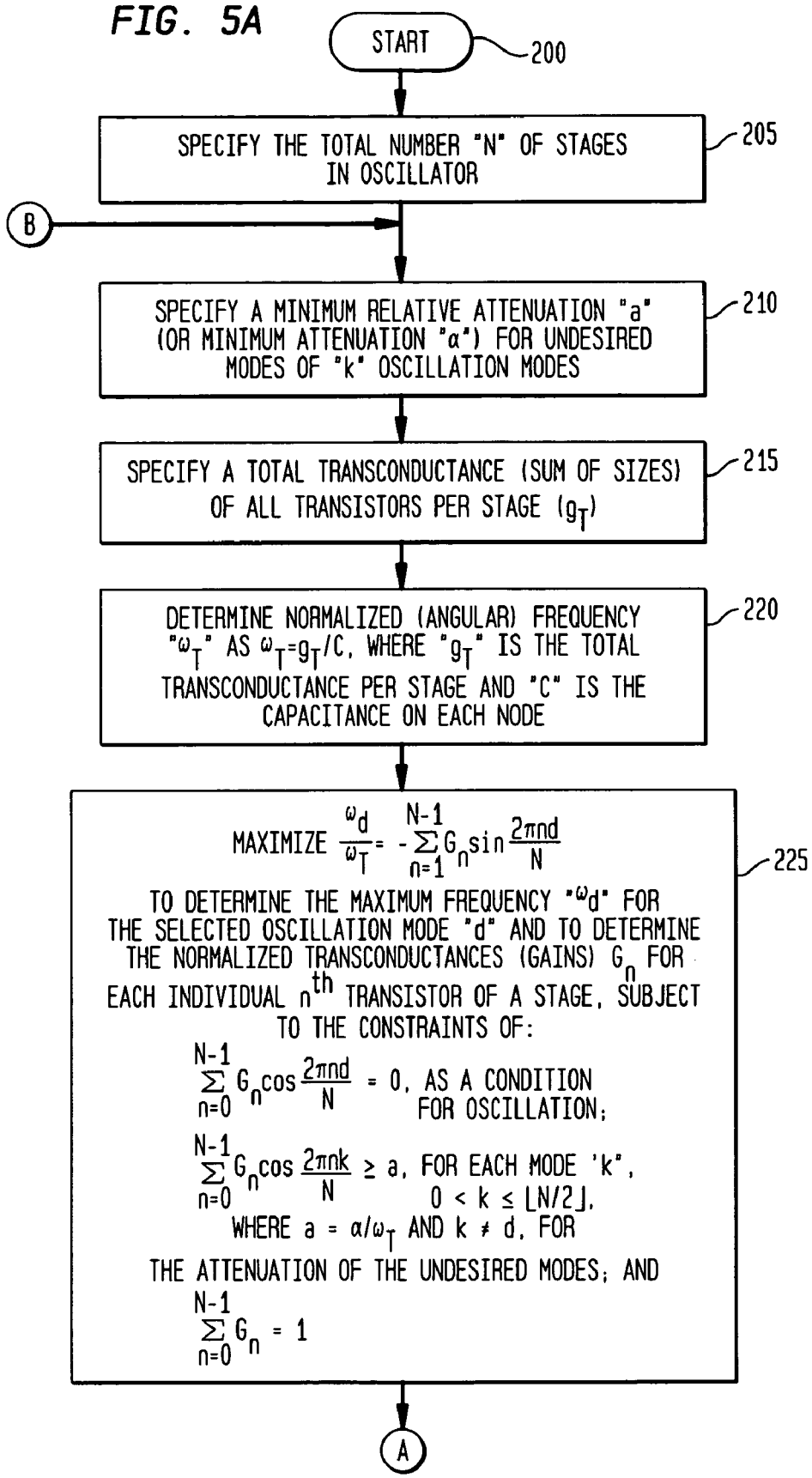

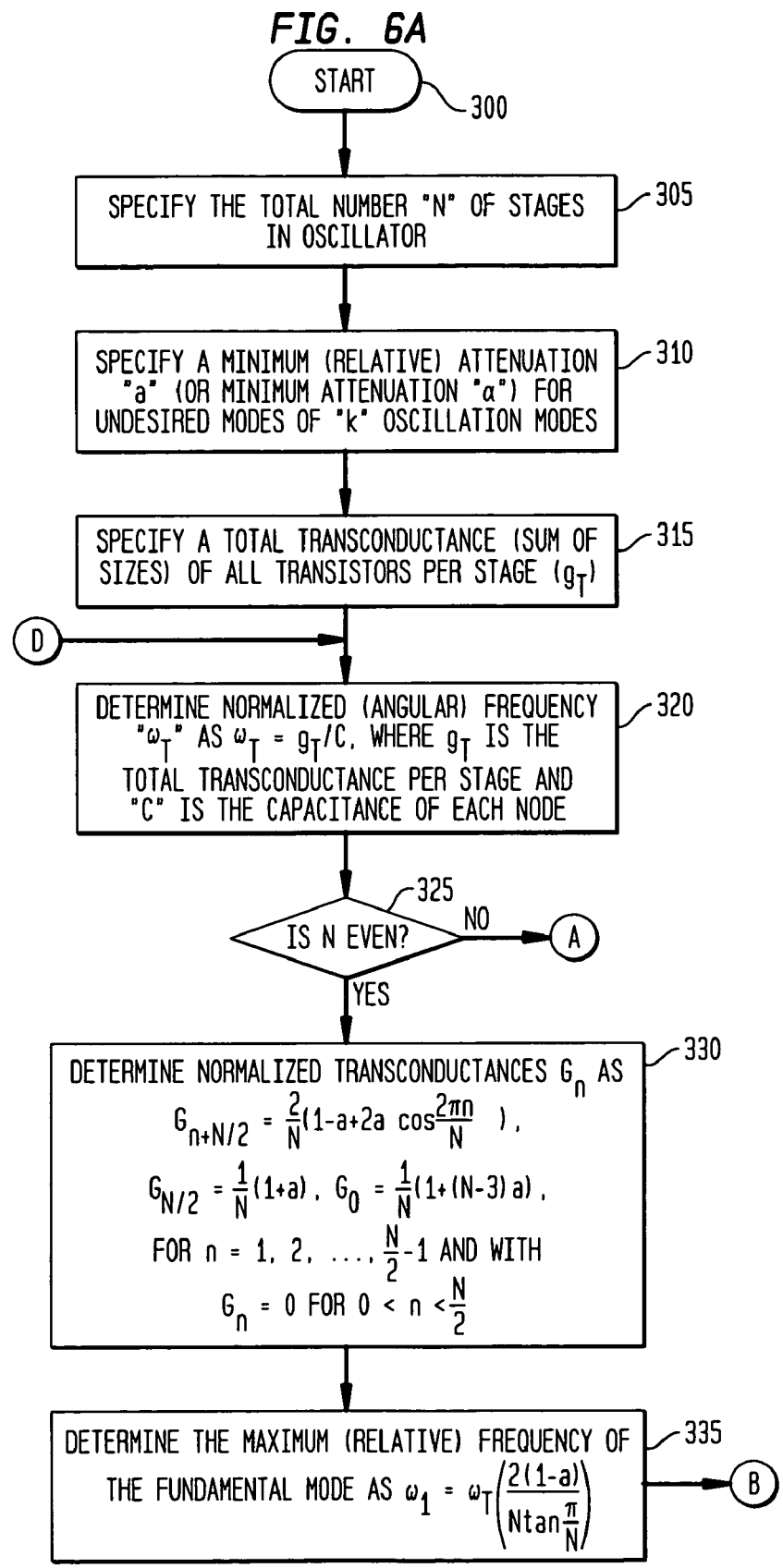

340 — DETERMINE NORMALIZED TRANSCONDUCTANCES $G_n$ AS $$G_{n + \frac{N+1}{2}} = \frac{2}{N}(1-a+2a\cos[(2n+1)\frac{\pi}{N}]),$$

$$G_0 = \frac{1}{N}(1+(N-3)a) \text{ FOR } n = 0, 1, \ldots, \frac{N-3}{2},$$

WITH $G_n = 0$ FOR $0 < n < \frac{N+1}{2}$.

↓

345 — DETERMINE THE MAXIMUM (RELATIVE) FREQUENCY OF THE FUNDAMENTAL MODE AS $$\omega_1 = \omega_T \left[ \frac{1-a}{N\tan\frac{\pi}{2N}} + \frac{a}{N}\tan\frac{\pi}{N} \right]$$

(B) →  ↓

350 — USING NORMALIZED TRANSCONDUCTANCES, DETERMINE (AS PRECISE VALUES) RELATIVE SIZES OF THE TRANSISTORS ($g_i$) OF EACH STAGE, AND USING THE PRECISE ($g_i$), DETERMINE THE MAXIMUM FREQUENCY OF OSCILLATION, THE (RELATIVE) ATTENUATION, AND THE MAXIMUM LOAD TRANSCONDUCTANCE FOR EACH MODE (EQUATIONS 23-25)

↓

355 — USING THE PRECISE VALUES FOR ($g_i$), ROUND OFF (OR OTHERWISE DETERMINE) FABRICATION VALUES FOR ALL $g_i$, AND USING THE FABRICATION VALUES FOR ALL $g_i$, DETERMINE THE MAXIMUM FREQUENCY OF OSCILLATION, THE (RELATIVE) ATTENUATION, AND THE MAXIMUM LOAD TRANSCONDUCTANCE, FOR EACH MODE, ALSO AS FABRICATION VALUES (USING EQUATIONS 23, 24 AND 25)

↓ (C)

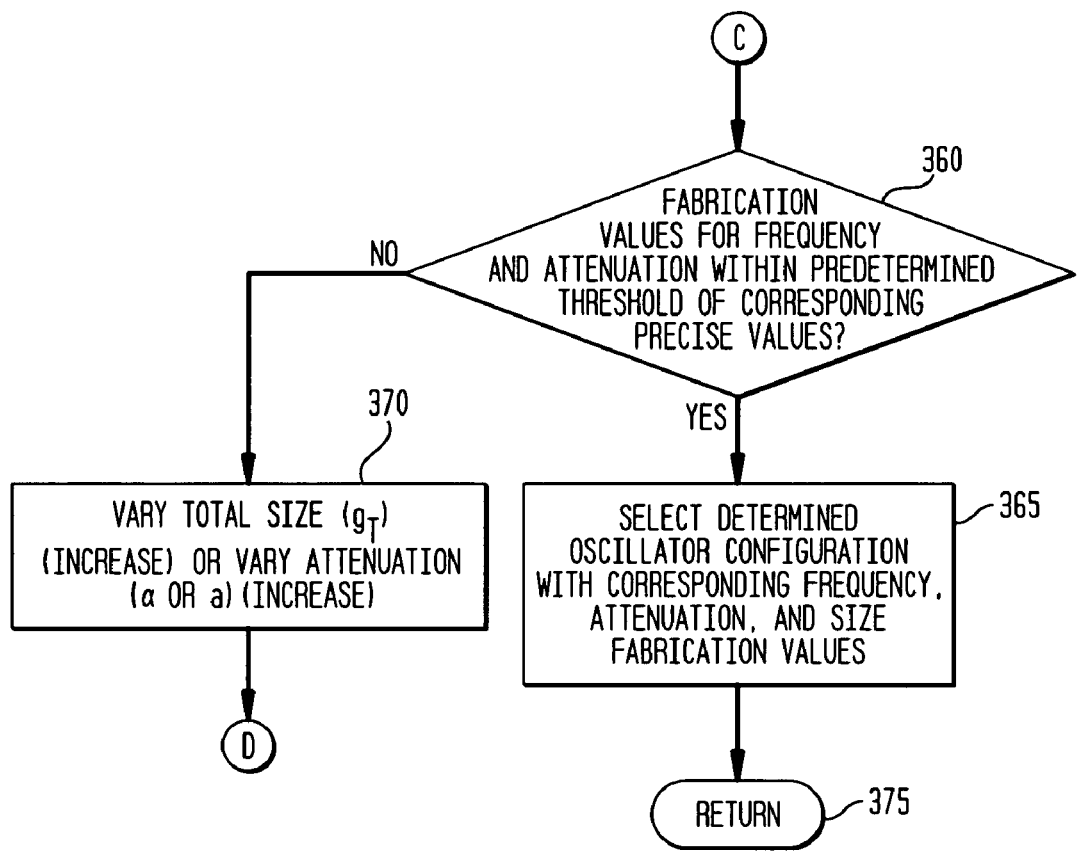

FIG. 7A

```
xopt[a_, sg_, n_, d_, xl_] := Module[{g},
  n2 = Floor[n/2];
  wr = Array[N[Cos[2 Pi #1 #2 /n]]&, {n, n2+1}, 0];
  wi = Array[N[Sin[2 Pi # d / n]]&, {n}, 0];
  gv = Array[g, {n}, 0];
  (g[[#]] = 0)& /@ xl;
  rd = gv . wr;
  id = gv . wi;
  d2 = If[d > n2, n - d, d];
  gd = gv /. ConstrainedMax[-id,
    Join[
      {rd[[1]] == 1},
      {rd[[d2 + 1]] == 0},
      DropTable[rd[[i]] > a, {i, 2, n2 + 1}], {d2}]
  ], Cases[gv, x_/; x=!=0]][[2]]];
  Return[gd sg]
]

sopt[a_, sg_, n_, d_] := xopt[a, sg, n, d, {}]
```

FIG. 7B

```
loop[gc_] := Module[{n1, w, k, dm, gx},
  n = Length[gc];        (* number of stages *)
  n1 = n - 1;
  w = Table[N[E^ (2 Pi I j k / n)], {j, n1}, {k, 0, n1}];
  gx = Drop[gc, 1];
  dm = gx . w;
  rs = Re[dm]; is = Im[dm];
  t = Sort[
    Table[{m, rs[[m + 1]], is [[m + 1]]}, {m, 0, n1}]&
    (#1[[2]] < #2[[2]])&
  ];
  rd = t[[1, 2]];
  as = rd - Plus@@gx;
  t2 = {
    #[[1]], #[[3]]/as, (rd-#[[2]])/as, -#[[2]]
    } & /@ t;
  tt = TableForm[
    Cases[Chop[t2] x_/; x[[2]] >= 0 ],
    TableHeadings -> {None, {"Mode", "Frequency",
      "Attenuation (rel)", "g0 (osc)"}}
  ];
  Return[tt]
]
```

FIG. 7C

```
gex[a_, sg_, n_] := Module[{g},
  g0 = (1 + (n - 3) a) / n;
  If [EvenQ[n],
    (* solution for even n: *)
    g = Array[
      (2 / n) (1 - a + 2 a Cos[2 Pi # / n]) &,
      n / 2 - 1];
    gn = (1 + a) / n;
    g = Join[{g0}, Table[0, {n / 2 - 1}], {gn}, g] // N,
    (* solution for odd n: *)
    g = Array[
      (2 / n) (1 - a + 2 a Cos[(2 # - 1) Pi / n]) &,
      (n - 1) / 2] // N;
    g = Join[{g0}, Table[0, {(n - 1) / 2}], g];
  ];
  Return[g sg]
]
```

FIG. 8

```
a = .07;
sg = 11;
n = 6;
d = 1;
g = sopt[a, sg, n, d];
gr = Round[g];
{TableForm[Transpose[{Range[n] - 1, g, gr}],
TableHeadings -> {None, {"n", "gn", "Round[gn]"}}]
,
"", loop[g], "",
loop[gr]}//TableForm
```

| n | gn | Round[gn] |
|---|---|---|
| 0 | 2.21833 | 2 |
| 1 | 0 | 0 |
| 2 | 0 | 0 |
| 3 | 1.96167 | 2 |
| 4 | 3.66667 | 4 |
| 5 | 3.15333 | 3 |

| Mode | Frequency | Attenuation (rel) | g0 (osc) |
|---|---|---|---|
| 1 | 0.536936 | 0 | 2.21833 |
| 3 | 0 | 0.07 | 1.44833 |
| 4 | 0.0404145 | 0.07 | 1.44833 |
| 0 | 0 | 1. | -8.78167 |

| Mode | Frequency | Attenuation (rel) | g0 (osc) |
|---|---|---|---|
| 1 | 0.527146 | 0 | 2.5 |
| 4 | 0.0753066 | 0.0869565 | 1.5 |
| 3 | 0 | 0.130435 | 1. |
| 0 | 0 | 1. | -9. |

FIG. 9

```
a = .07;
sg = 11;
n = 8;
d = 1;
g = sopt[a, sg, n, d];
gr = Round[g];
{TableForm[Transpose[{Range[n] - 1, g, gr}],
 TableHeadings -> {None, {"n", "gn", "Round[gn]"}}
 ],
  "", loop[g], "",
  loop[gr]}//TableForm
```

| n | gn      | Round[gn] |
|---|---------|-----------|
| 0 | 1.85625 | 2         |
| 1 | 0       | 0         |
| 2 | 0       | 0         |
| 3 | 0       | 0         |
| 4 | 1.47125 | 1         |
| 5 | 2.82974 | 3         |
| 6 | 2.5575  | 3         |
| 7 | 2.28526 | 2         |

| Mode | Frequency | Attenuation (rel) | g0 (osc) |
|------|-----------|-------------------|----------|
| 1    | 0.561305  | 0                 | 1.85625  |
| 6    | 0.0494975 | 0.07              | 1.08625  |
| 4    | 0         | 0.07              | 1.08625  |
| 3    | 0.0963047 | 0.07              | 1.08625  |
| 0    | 0         | 1.                | -9.14375 |

| Mode | Frequency | Attenutation (rel) | g0 (osc) |
|------|-----------|--------------------|----------|
| 6    | 0.0909091 | 0                  | 2.       |
| 1    | 0.594139  | 0.0266267          | 1.70711  |
| 4    | 0         | 0.0909091          | 1.       |
| 3    | 0.0486849 | 0.155192           | 0.292893 |
| 0    | 0         | 1.                 | -9.      |

FIG. 10

```
a = .07;
sg = 19;
n = 8;
d = 1;
g = sopt[a, sg, n, d];
gr = Round[g];
{TableForm[Transpose[{Range[n] - 1, g, gr}],
  TableHeadings -> {None, {"n", "gn", "Round[gn]"}}],
   "", loop[g], "",
   loop[gr]}//TableForm
```

| n | gn | Round[gn] |
|---|-----|-----------|
| 0 | 3.20625 | 3 |
| 1 | 0 | 0 |
| 2 | 0 | 0 |
| 3 | 0 | 0 |
| 4 | 2.54125 | 3 |
| 5 | 4.88773 | 5 |
| 6 | 4.4175 | 4 |
| 7 | 3.94727 | 4 |

| Mode | Frequency | Attenuation (rel) | g0 (osc) |
|------|-----------|-------------------|----------|
| 1 | 0.561305 | 0 | 3.20625 |
| 6 | 0.0494975 | 0.07 | 1.87625 |
| 4 | 0 | 0.07 | 1.87625 |
| 3 | 0.0963047 | 0.07 | 1.87625 |
| 0 | 0 | 1 | -15.7937 |

| Mode | Frequency | Attenutation (rel) | g0 (osc) |
|------|-----------|--------------------|----------|
| 1 | 0.5259 | 0 | 3.70711 |
| 3 | 0.119955 | 0.0717616 | 2.29289 |
| 4 | 0 | 0.0866239 | 2. |
| 6 | 0.0507431 | 0.137367 | 1. |
| 0 | 0 | 1 | -16. |

FIG. 11

```
a = .25;
sg = 11;
n = 8;
d = 1;
g = sopt[a, sg, n, d];
gr = Round[g];
{TableForm[Transpose[{Range[n] - 1, g, gr}],
  TableHeadings -> {None, {"n", "gn", "Round[gn]"}}],
  "", loop[g], "",
  loop[gr]}//TableForm
```

| n | gn      | Round[gn] |
|---|---------|-----------|
| 0 | 3.09375 | 3         |
| 1 | 0       | 0         |
| 2 | 0       | 0         |
| 3 | 0       | 0         |
| 4 | 1.71875 | 2         |
| 5 | 3.03477 | 3         |
| 6 | 2.0625  | 2         |
| 7 | 1.09023 | 1         |

| Mode | Frequency | Attenuation (rel) | g0 (osc) |
|------|-----------|-------------------|----------|
| 1    | 0.452665  | 0                 | 3.09375  |
| 6    | 0.176777  | 0.25              | 0.34375  |
| 4    | 0         | 0.25              | 0.34375  |
| 3    | 0.077665  | 0.25              | 0.34375  |
| 0    | 0         | 1.                | -7.90625 |

| Mode | Frequency | Attenuation (rel) | g0 (osc) |
|------|-----------|-------------------|----------|
| 1    | 0.423019  | 0                 | 3.41421  |
| 3    | 0.0725786 | 0.247799          | 0.585786 |
| 6    | 0.17522   | 0.299119          | 0        |
| 4    | 0         | 0.299119          | 0        |
| 0    | 0         | 1.                | -8.      |

```
a = .07;
sg = 43;                FIG. 12
n = 16;
d = 1;
g = gex[a, sg, n];
(* Optimize using exact method *)
gr = Round[g];
{TableForm[Transpose[{Range[n] - 1, g, gr}],
 TableHeadings -> {None, {"n", "gn", "Round[gn]"}}],
 "", loop[g], "",
 loop[gr]}//TableForm
```

| n  | gn       | Round[gn] |
|----|----------|-----------|
| 0  | 5.13313  | 5         |
| 1  | 0        | 0         |
| 2  | 0        | 0         |
| 3  | 0        | 0         |
| 4  | 0        | 0         |
| 5  | 0        | 0         |
| 6  | 0        | 0         |
| 7  | 0        | 0         |
| 8  | 2.87563  | 3         |
| 9  | 5.69397  | 6         |
| 10 | 5.53085  | 6         |
| 11 | 5.28672  | 5         |
| 12 | 4.99875  | 5         |
| 13 | 4.71078  | 5         |
| 14 | 4.46665  | 4         |
| 15 | 4.30353  | 4         |

| Mode | Frequency  | Attenuation (rel) | g0 (osc) |
|------|------------|-------------------|----------|
| 1    | 0.584428   | 0                 | 5.13313  |
| 12   | 0.0189419  | 0.07              | 2.12312  |
| 14   | 0.0570845  | 0.07              | 2.12312  |
| 7    | 0.0231236  | 0.07              | 2.12312  |
| 5    | 0.0776758  | 0.07              | 2.12312  |
| 10   | 0.00758705 | 0.07              | 2.12312  |
| 8    | 0          | 0.07              | 2.12312  |
| 3    | 0.17398    | 0.07              | 2.12312  |
| 0    | 0          | 1.                | -37.8669 |

| Mode | Frequency  | Attenuation (rel) | g0 (osc) |
|------|------------|-------------------|----------|
| 1    | 0.567907   | 0                 | 6.26197  |
| 7    | 0.0224699  | 0.0834919         | 2.56645  |
| 3    | 0.169062   | 0.0883562         | 2.35115  |
| 12   | 0.0451855  | 0.0962897         | 2.       |
| 8    | 0          | 0.0962897         | 2.       |
| 14   | 0.0771365  | 0.0962897         | 2.       |
| 6    | 0.0132345  | 0.0962897         | 2.       |
| 5    | 0.07548    | 0.12294           | 0.82042  |
| 0    | 0          | 1.                | -38.     |

FIG. 13

```
a = .07;
sg = 43;
n = 16;
d = 1;
g = sopt[a, sg, n, 1];
(* same as figure 11, but optimize using simplex method;
   obtain same frequency in mode 1, but with different
   pattern of interconnects *)
gr = Round[g];
{TableForm[Transpose[{Range[n] - 1, g, gr}],
  TableHeadings -> {None, {"n", "gn", "Round[gn]"}}],
 "", loop[g], "",
 loop[gr]}//TableForm
```

| n | gn | Round[gn] |
|---|----|-----------|
| 0 | 8.00875 | 8 |
| 1 | 0 | 0 |
| 2 | 0 | 0 |
| 3 | 0 | 0 |
| 4 | 0 | 0 |
| 5 | 0 | 0 |
| 6 | 0 | 0 |
| 7 | 0 | 0 |
| 8 | 0 | 0 |
| 9 | 3.7427 | 4 |
| 10 | 9.5976 | 10 |
| 11 | 9.9975 | 10 |
| 12 | 4.99875 | 5 |
| 13 | 0 | 0 |
| 14 | 0.399904 | 0 |
| 15 | 6.2548 | 6 |

| Mode | Frequency | Attenuation (rel) | g0 (osc) |
|------|-----------|-------------------|----------|
| 1 | 0.584428 | 0 | 8.00875 |
| 14 | 0.336992 | 0.07 | 4.99875 |
| 4 | 0.290921 | 0.07 | 4.99875 |
| 8 | 0 | 0.07 | 4.99875 |
| 7 | 0.0231236 | 0.07 | 4.99875 |
| 6 | 0.0908073 | 0.07 | 4.99875 |
| 5 | 0.0776758 | 0.100341 | 3.69407 |
| 3 | 0.17398 | 0.574659 | -16.7016 |
| 0 | 0 | 1. | -34.9913 |

| Mode | Frequency | Attenuation (rel) | g0 (osc) |
|------|-----------|-------------------|----------|
| 1 | 0.570638 | 0 | 9.05014 |
| 7 | 0.0225779 | 0.0898556 | 5.09199 |
| 14 | 0.355433 | 0.0919439 | 5. |
| 8 | 0 | 0.0919439 | 5. |
| 6 | 0.0985955 | 0.0919439 | 5. |
| 4 | 0.272417 | 0.0919439 | 5. |
| 5 | 0.075843 | 0.138866 | 2.93309 |
| 3 | 0.169875 | 0.593083 | -17.0752 |
| 0 | 0 | 1. | -35. |

FIG. 14

```
a = .07;
sg = 43;
n = 16;
d = 1;
noConnect = {14, 15};
g = xopt[a, sg, n, 1, noConnect];
(* same as figure 12, but exclude two interconnections
    when optimizing; resulting frequency is somewhat less,
    but now have only 4 interconnects per stage *)
gr = Round[g];
{TableForm[Transpose[{Range[n] - 1, g, gr}],
  TableHeadings -> {None, {"n", "gn", "Round[gn]"}}],
  "", loop[g], "",
  loop[gr]}//TableForm
```

| n | gn | Round[gn] |
|---|---|---|
| 0 | 9.67516 | 10 |
| 1 | 0 | 0 |
| 2 | 0 | 0 |
| 3 | 0 | 0 |
| 4 | 0 | 0 |
| 5 | 0 | 0 |
| 6 | 0 | 0 |
| 7 | 0 | 0 |
| 8 | 0 | 0 |
| 9 | 7.5671 | 8 |
| 10 | 10.2493 | 10 |
| 11 | 0 | 0 |
| 12 | 3.58411 | 4 |
| 13 | 11.9244 | 12 |
| 14 | 0 | 0 |
| 15 | 0 | 0 |

| Mode | Frequency | Attenuation (rel) | g0 (osc) |
|---|---|---|---|
| 1 | 0.57544 | 0 | 9.67516 |
| 14 | 0.166703 | 0.07 | 6.66516 |
| 12 | 0.45329 | 0.07 | 6.66516 |
| 3 | 0.141652 | 0.07 | 6.66516 |
| 8 | 0. | 0.09342 | 5.6581 |
| 7 | 0.0716524 | 0.112922 | 4.81949 |
| 6 | 0.310007 | 0.213305 | 0.503056 |
| 11 | 0.0287299 | 0.717092 | -21.1598 |
| 0 | 0 | 1. | -33.3248 |

| Mode | Frequency | Attenuation (rel) | g0 (osc) |
|---|---|---|---|
| 1 | 0.574861 | 0 | 9.8699 |
| 3 | 0.133803 | 0.0636643 | 7.07695 |
| 14 | 0.163474 | 0.0693294 | 6.82843 |
| 12 | 0.455893 | 0.0882132 | 6. |
| 8 | 0. | 0.0882132 | 6. |
| 7 | 0.0701382 | 0.127597 | 4.27223 |
| 6 | 0.29242 | 0.198276 | 1.17157 |
| 11 | 0.00620546 | 0.708663 | -21.2191 |
| 0 | 0 | 1. | -34. |

FIG. 17
(PRIOR ART)

| n | gn |
|---|---|
| 0 | 5.472 |
| 1 | 0 |
| 2 | 0 |
| 3 | 10.0153 |
| 4 | 8.51268 |

| Mode | Frequency | Attenuation (rel) | g0 (osc) |
|---|---|---|---|
| 1 | 0.582621 | 0 | 5.472 |
| 3 | 0.188396 | 0.07 | 3.792 |
| 0 | 0 | 1. | -18.528 |

| n | ga | gb | gc |
|---|---|---|---|
| 0 | 0 | 0 | 0 |
| 1 | 0 | 0 | 0 |
| 2 | 0 | 0 | 0 |
| 3 | 10 | 10 | 10 |
| 4 | 8 | 12 | 25 |

| Mode | Frequency | Attenuation (rel) | g0 (osc) |
|---|---|---|---|
| 1 | 0.571017 | 0 | 5.61803 |
| 3 | 0.203585 | 0.0946763 | 3.38197 |
| 0 | 0 | 1. | -18. |

| Mode | Frequency | Attenuation (rel) | g0 (osc) |
|---|---|---|---|
| 3 | 0.0858599 | 0 | 6.61803 |
| 1 | 0.604183 | 0.0781349 | 4.38197 |
| 0 | 0 | 1. | -22. |

| Mode | Frequency | Attenuation (rel) | g0 (osc) |
|---|---|---|---|
| 2 | 0.0994349 | 0 | 17.1353 |
| 1 | 0.568795 | 0.321673 | 0.364745 |
| 0 | 0 | 1. | -35. | ial
INTERCONNECTED MULTI-STAGE OSCILLATOR

CROSS-REFERENCE TO A RELATED APPLICATION

This application is related to Robert Renninger, U.S. patent application Ser. No. 10/304,834, now U.S. Pat. No. 6,801,095, entitled "Method, Program and System for Designing an Interconnected Multi-stage Oscillator", filed concurrently herewith, commonly assigned to Agere Systems, Inc., and incorporated by reference herein, with priority claimed for all commonly disclosed subject matter (the "related application").

FIELD OF THE INVENTION

The present invention is related, in general, to electronic oscillators, and more particularly, to an interconnected multi-stage oscillator apparatus and a corresponding system, program and method for designing an interconnected multi-stage oscillator.

BACKGROUND OF THE INVENTION

Oscillators are utilized in a wide variety of applications, such as voltage controlled oscillators used in phase-locked loops. Such oscillators often suffer from certain defects, such as instability and lock up. In a particular mode of oscillation, various prior art oscillators may suffer catastrophic changes, such as collapsing to a lower frequency of oscillation in a different mode pattern.

One such prior art oscillator is illustrated in Sun et al. U.S. Pat. No. 6,075,419, issued Jun. 13, 2000 (the "Sun patent"). The Sun patent illustrates a 5-stage ring oscillator, where each stage is an inverter. There are two inputs to each inverter, one input being the output from the preceding stage, and the other input being the inverted output from a succeeding stage. While the oscillator of the Sun patent allows for adjustment of the gain in the various stages, using a control signal, it continues to suffer from instability problems, including the catastrophic problem of collapsing into a bad mode of oscillation. These problems of the oscillator of the Sun patent are illustrated in FIGS. 17 and 18, discussed in greater detail below.

Multi-stage oscillators have, in the prior art, been highly limited in terms of frequency characteristics. Most of these multi-stage oscillators are unable to achieve the desired frequency range with use of additional stages, because given their various designs, these additional stages actually lower the maximum frequency of operation.

Other prior art oscillators are also subject to these instability problems. The prior art does not provide a consistent methodology both to guarantee stability of oscillation of a desired mode of oscillation, and to predict the dynamics of the oscillator in operation. In addition, the prior art does not provide for any type of interconnected oscillator having more than five stages and more than two inputs per stage, or any design process to create such multi-stage interconnected oscillators having the desired stability characteristics. In addition, the prior art does not provide for any ability to provide higher frequencies of oscillation by increasing the number of stages employed.

BRIEF DESCRIPTION OF THE DRAWINGS

The objects, features and advantages of the present invention will be more readily appreciated upon reference to the following disclosure when considered in conjunction with the accompanying drawings, in which:

FIG. 6 is a flow diagram illustrating a second method embodiment for designing and modeling a multi-stage interconnected oscillator in accordance with the present invention.

FIG. 7, divided into sections 7A, 7B, and 7C, is a program listing which illustrates an exemplary program implementing the method embodiments for designing and modeling a multi-stage interconnected oscillator in accordance with the present invention.

FIG. 8 is a listing of the input parameters and corresponding output of the programs of FIG. 7 for a six stage oscillator in accordance with the present invention.

FIG. 9 is a listing of the input parameters and corresponding output of the programs of FIG. 7 for an eight stage oscillator in accordance with the present invention.

FIG. 10 is a listing of the input parameters and corresponding output of the programs of FIG. 7 for an eight stage oscillator in accordance with the present invention.

FIG. 11 is a listing of the input parameters and corresponding output of the programs of FIG. 7 for an eight stage oscillator in accordance with the present invention.

FIG. 12 is a listing of the input parameters and corresponding output of the programs of FIG. 7 for a sixteen stage oscillator in accordance with the present invention.

FIG. 13 is a listing of the input parameters and corresponding output of the programs of FIG. 7 for a sixteen stage oscillator in accordance with the present invention.

FIG. 14 is a listing of the input parameters and corresponding output of the programs of FIG. 7 for a sixteen stage oscillator in accordance with the present invention.

FIG. 17 is a listing of the input parameters and corresponding output of the programs of FIG. 7 for the prior art oscillator of the Sun patent.

DETAILED DESCRIPTION OF THE INVENTION

Figure 1:
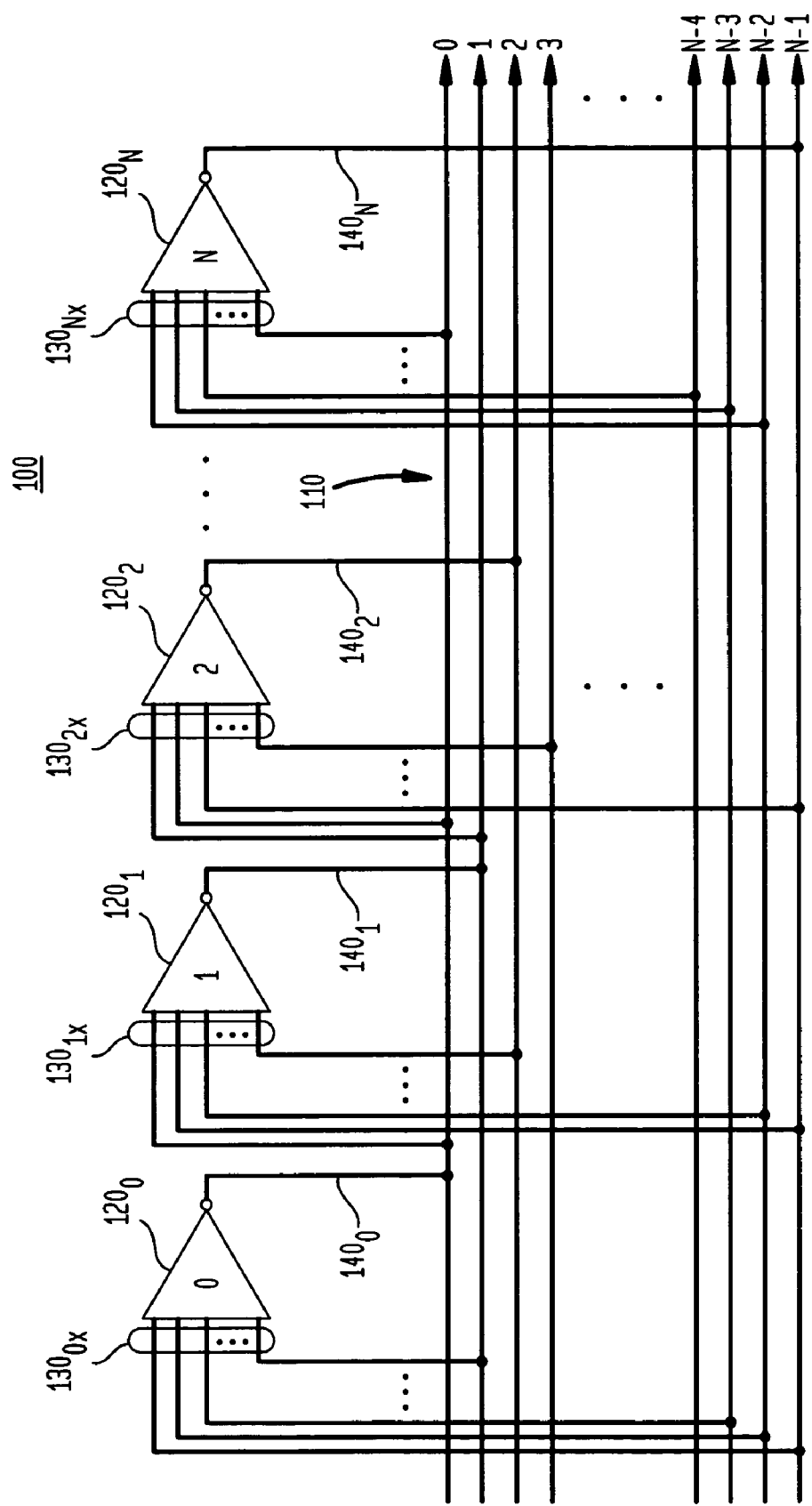
FIG. 1 is a block diagram illustrating an exemplary multi-stage interconnected oscillator in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

The multi-stage, interconnected oscillator of the present invention may be designed to completely avoid instability problems. The present invention provides a consistent methodology and mathematical basis, both to guarantee stability of a desired mode of oscillation, and to further predict the dynamics of the oscillator in operation, including determining the other existing modes, their frequencies, and their attenuations. In addition, the invention provides for an interconnected oscillator having a large number of interconnected stages and more than two inputs per stage, along with a design process to create such multi-stage interconnected oscillators having the desired stability and frequency characteristics. In addition, the invention provides for the ability to adjust frequencies of oscillation by increasing the number of stages employed and by varying various circuit parameters, such as load transconductances and transistor size.

1. Oscillator Circuits of the Present Invention:

FIG. 1 is a block diagram illustrating an exemplary multi-stage interconnected oscillator 100 in accordance with the present invention. The interconnected oscillators of the present invention are defined as consisting of a plurality "N" of interconnected inverting gain stages 120 (illustrated as stages $120_0$, $120_1$, $120_2$ through $120_N$), with each inverting gain stage 120 consisting of a plurality "j" of interconnected input transistors (or equivalent inverters or amplifiers), separately illustrated in FIGS. 2 and 3. The inputs 130 to the plurality of (input) transistors forming each gain stage (illustrated as corresponding pluralities of inputs $130_{0x}$, $130_{1x}$, $130_{2x}$ through $130_{Nx}$) are coupled to the outputs (or, equivalently, nodes) 140 of other stages (illustrated as outputs $140_0$, $140_1$, $140_2$ through $140_N$), utilizing an interconnection methodology discussed below. For the inputs $130_{0x}$, $130_{1x}$, $130_{2x}$ through $130_{Nx}$, the first subscript index corresponds to the stage number (0 through N), while the second index "x" for the pluralities of inputs corresponds to the plurality "j" input transistors within each $n^{th}$ stage, numbered 0, 1, 2, and so on, through (j-1), such that an input $130_{85}$, for example, corresponds to the sixth input (j=5) for the ninth stage (or, more generally, an input $130_{(Y-1)(X-1)}$ is in the $y^{th}$ stage and corresponds to the $x^{th}$ input (j=x) for that $y^{th}$ stage). In the exemplary oscillator embodiment 100, the interconnection is accomplished through a connection matrix 110, whereby any selected output 140 may be fed back and coupled to any selected input 130. (It should be noted that the specific output 140 to input 130 couplings illustrated in FIG. 1 are for ease of explanation only, with actual couplings determined as discussed below.) In addition, any selected output 140 may be provided through the connection matrix 110 (e.g., outputs $140_0$, $140_1$, $140_2$ through $140_N$), such as to select a particular oscillation phase. For ease of discussion, known circuit features, such as power supply and ground connections, are not separately illustrated.

For these interconnected oscillators 100 of the present invention, a linearized differential equation for node voltages, referred to herein as "Equation 1", with each node being an output 140 from a given inverting gain stage 120, may be written substantially as:

$$C\frac{dV_n}{dt} = -\sum_{j=0}^{N-1} g_j V_{n-j} = -\sum_{j=0}^{N-1} g_{n-j} V_j. \quad (1)$$

where C is the capacitance for each node, $g_j$ is a transconductance of $j^{th}$ input transistor of the $n^{th}$ stage, $V_{(n-j)}$ is a voltage of a $(n-j)^{th}$ output node, "N" is a total number of the plurality of stages, and "j" is a transistor number of the plurality of input transistors within each stage and an index of summation. Using the known convention of counting beginning with zero, n refers to the stage 120 number (e.g., n=0 is a first stage, n=7 is an eighth stage, and so on), and j is the transistor number within a given stage (e.g., j=0 is a first transistor, j=3 is a fourth transistor, and so on) which is provided with a corresponding input 130. The term $g_0$, which will be further discussed below, represents the load on each node, or its conductance to ground, depending upon the node number and the oscillator 100 configuration. The indices of equation 1 "wrap around" modulo N so that, for example, $V_{-n}$ refers to the same node as $V_{N-n}$. As a consequence, the invention utilizes an interconnection methodology for the array of inverting gain stages 120 which is symmetrical with respect to the node number. (It should also be noted that, throughout this specification, equations will be referred to by reference numbers next to the listed equation, as is customary). This interconnection strategy, and Equation 1, will be discussed in considerably greater detail below.

Throughout this specification, the transistors of import for the interconnection methodology and size determinations of the present invention are referred to as "input" transistors or, more frequently, simply as transistors, in contrast to other current sourcing transistors which are also utilized within a stage 120 and which are discussed below. Any of these transistors (input or current sourcing) may be of any form or type of inverting gain element, and may be considered equivalent to any such inverting gain element, such as MOS (metal oxide silicon) and bipolar transistors, including NMOS and PMOS silicon field-effect transistors (FETs), gallium arsenide (GaAs) and other compound semiconductor FETs, silicon and silicon-germanium bipolar transistors, BiCMOS transistors, thermionic integrated circuit gain elements, or any other circuit element that can be configured to produce an output current proportional to a control (or input) voltage, with a negative constant of proportionality or transconductance. While not included within the scope of the present invention, it is also possible that older devices such as vacuum tubes could also be utilized.

It should be noted that the oscillator 100 of the invention will utilize identical stages 120, with each stage having a varying pattern of multiple inputs coupled to multiple outputs, as indicated above and as discussed below, and with each stage providing a different oscillation phase. Within each stage 120, the various input transistors will have various sizes, with each input transistor size referred to using a transconductance parameter $G_n$ (which has been normalized to the total transistor size within the stage (sum of the sizes of the individual transistors) $g_T$). The oscillator 100 will be optimized, for a given number of stages N and a selected attenuation α of undesired modes, by varying the individual input transistor sizes ($G_n$'s) within the stages while holding constant the total size $g_T$ of each stage.

In the various embodiments of the invention illustrated below, separate load transistors $G_0$ may or may not be utilized, depending upon whether there is already sufficient parasitic loading within the circuit, and separate capacitive devices (as "C") may or may not be utilized, also depending upon whether there is sufficient parasitic capacitance within the circuit. When utilized, the load transistors (transconductances $G_0$ or $g_0$) are considered "input" transistors herein, and are included within the total transconductance $g_T$ of the plurality of input transistors. As a consequence, and as illustrated in greater detail below, the specification of $g_T$ includes the transconductance of any load transistor (which may be implemented as a parasitic load).

In addition to the interconnection methodology of the present invention, during the design process, the size ratios of the plurality of input transistors is established. With respect to the transconductance ($G_0$ or $g_0$) of any load transistor, however, its fabrication value should be smaller than the value computed, for example, in Equation 25 discussed below, for the dominant mode (as illustrated in the $g_0$ column in FIGS. 9–14).

By increasing the number of stages N in the oscillator 100 of the present invention, the maximum frequency of oscillation does not decrease; the maximum frequency of oscillation will continue to increase until a plateau (asymptotic) level is reached eventually. As a consequence, the oscillator of the invention can provide significantly more oscillation phases by increasing the number of stages, without sacrificing the maximum frequency of oscillation. (It should be noted that optimization is used herein in a very broad sense, to mean and include merely desired or acceptable for one or more purposes, for example, and not just meaning "most" desired or favorable.)

It should also be noted that the input coupled to output interconnection pattern of the present invention is independent of any numbering scheme utilized. Any changes in numbering results in the same interconnection pattern, with the same nodes, the same frequency and attenuation characteristics for each mode, but with stages and modes having different corresponding numbers.

Lastly, it should be noted that, for all equations herein, any and all equalities should be considered to be substantially or approximately equal, rather than exactly or precisely equal, as variations from theoretical exactness will occur in implementation of the oscillator 100 and in actual practice or performance due to, among other things, fabrication tolerances, fabrication variations, rounding error, and so on.

Figure 2:
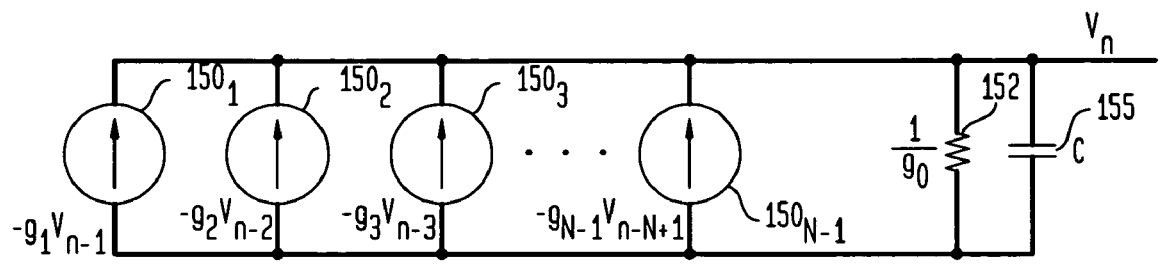
FIG. 2 is a high-level block diagram illustrating an exemplary single stage of a multi-stage interconnected oscillator in accordance with the present invention.

FIG. 2 is a high-level block diagram illustrating an exemplary single stage 120$_N$ of a multi-stage interconnected oscillator 100 in accordance with the present invention. As illustrated in FIG. 2, the various transistors of each stage, of any type or kind, are illustrated more generally as current sources 150$_1$ through 150$_{N-1}$. For j=0, which as discussed below is the load transconductance ($G_0$(or $g_0$), where $G_0$ 0), is illustrated as a resistor 152 (with corresponding resistance $1/g_0$), and with capacitor 155 representing the capacitance C of the stage 120$_N$.

Figure 3:
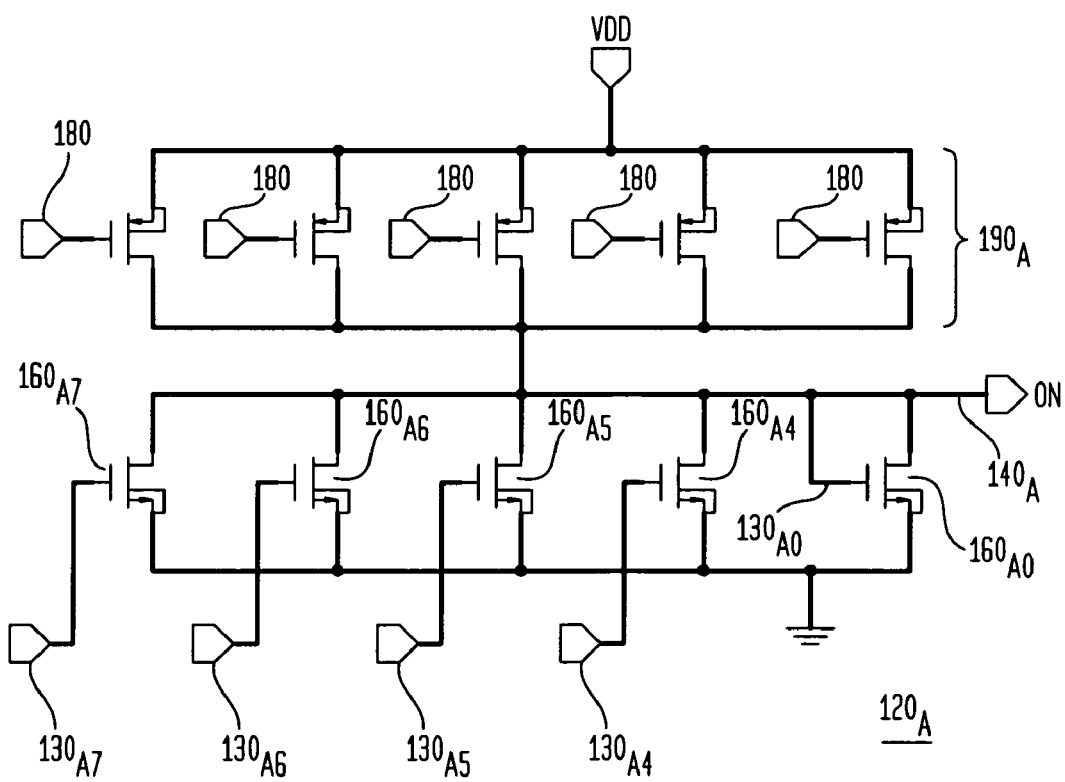
FIG. 3 is a circuit diagram illustrating an exemplary single stage of a multi-stage interconnected oscillator in accordance with the present invention.

FIG. 3 is a circuit diagram illustrating an exemplary single stage 120$_A$ of a multi-stage interconnected oscillator 100 in accordance with the present invention. While illustrated using CMOS p-type and n-type transistors (190 and 160, respectively) (as current sources 150), it should be understood that any type of transistor may be utilized equivalently. As illustrated, (p-type) transistors 190 (in addition to the transistors referred to as "input" transistors) are utilized for current sourcing, with control inputs 180. The bias voltage applied to the inputs 180 may also be used to vary the gain of the stage 120$_A$ to adjust the output frequency and thereby "tune" the oscillator 100. The "j" plurality of (inverting) input transistors 160, with j=8 in this example, are illustrated as (n-type) transistors 160$_{A4}$, 160$_{A5}$, 160$_{A6}$ and 160$_{A7}$, with corresponding inputs 130$_{A4}$, 130$_{A5}$, 130$_{A6}$ and 130$_{A7}$ (as these are the inputs 130 of the gain stage 120$_A$). (For ease of explanation, for this $A^{th}$ stage, the index "A" will be utilized, rather than (A-1)). Transistor 160$_{A0}$ provides the load ($G_0$, where $G_0$ 0, discussed below) for the stage 120$_A$. As discussed in greater detail below, transistors which would have been numbered and illustrated as 160$_{A1}$, 160$_{A2}$ and 160$_{A3}$ (for j=0 through 7) are not, in fact, illustrated and included in stage 120$_A$, as the methodology of the invention provides that their corresponding transconductances are zero, in this example. The output 140 for this exemplary stage is illustrated as output 140$_A$. (Frequently in the design methodology, the number of input transistors "x" will be (approximately) one-half of the number of stages N of the oscillator 100, plus any load transistor (x=(N/2)+1 for even N and x=(N+1)/2 for odd N).)

It should also be noted that using the interconnection methodology of the invention, the input (gate) 130$_{A0}$ to the load $G_0$ (transistor 160$_{A0}$) is coupled to the output of its own stage, in this case, output 140$_A$. In the preferred embodiment, this coupling of the input 130$_{N0}$ for the load $G_0$ (i.e., for j=0 in any $n^{th}$ stage 120$_N$) to the $n^{th}$ stage output 140$_N$ is done internally, within the stage itself, rather than utilizing the interconnection matrix 110. (This internal coupling for the load input is also implied in FIG. 1).

As an example, the stage 120$_A$ (with four inverting input transistors 160$_{A4}$, 160$_{A5}$, 160$_{A6}$ and 160$_{A7}$, with transistor 160$_{A0}$ as the load), may be utilized in an eight stage oscillator of the present invention, having stages 120$_0$ through 120$_7$. The interconnection of outputs 140 (as outputs 140$_0$, 140$_1$, 140$_2$ through 140$_7$) to inputs 130 may then be determined utilizing Equation 1, via interconnection matrix 110. Continuing with the example, for interconnection in accordance with the invention, for stage 120$_5$, the sixth stage, input 130$_{50}$ (load $G_0$ for the sixth stage) would be coupled to the output for its own stage, output 140$_5$ (as illustrated, output 140$_5$ for the sixth stage is output 140$_A$ for an $A^{th}$ stage), input 130$_{54}$ would be coupled to output 140$_1$, input 130$_{55}$ would be coupled to output 140$_0$, input 130$_{56}$ would be coupled to output 140$_7$, and input 130$_{57}$ would be coupled to output 140$_6$ (with assigned input and output correspondences for the three non-utilized (or non-existent) transistors being input 130$_{51}$, coupled to output 140$_4$, input 130$_{52}$ coupled to output 140$_3$, and input 130$_{53}$ coupled to output 140$_2$, for purposes of illustrating the connection methodology of Equation 1). For stage 120$_3$, the fourth stage, load input 130$_{30}$ would be coupled to the fourth stage's output 140$_3$, input 130$_{34}$ would be coupled to output 140$_7$, input 130$_{35}$ would be coupled to output 140$_6$, input 130$_{36}$ would be coupled to output 140$_5$, and input 130$_{37}$ would be coupled to output 140$_4$. For stage 120$_7$, the eighth stage, input 130$_{70}$ would be coupled to output 140$_7$, input 130$_{74}$ would be coupled to output 140$_3$, input 130$_{75}$ would be coupled to output 140$_2$, input 130$_{76}$ would be coupled to output 140$_1$, and input 130$_{77}$ would be coupled to output 140$_0$. For stage 120$_0$, the first stage, input 130$_{00}$ would be coupled to output 140$_0$, input 130$_{04}$ would be coupled to output 140$_4$, input 130$_{05}$ would be coupled to output 140$_3$, input 130$_{06}$ would be coupled to output 140$_2$, and input 130$_{07}$ would be coupled to output 140$_1$. These various examples may be repeated for other stages, and also serve to illustrate the connection methodology using modulo N for eight stages.

Also in accordance with the present invention, and as discussed in greater detail below with reference to FIGS. 5 through 7, the sizes of the various input transistors 160 will be determined based upon selected or desired parameters of a given implementation of the oscillator 100, such as selected frequency capability, the selected attenuation of undesired modes of oscillation, the total size of each stage 120, and the selected number of stages 120.

Figure 4:
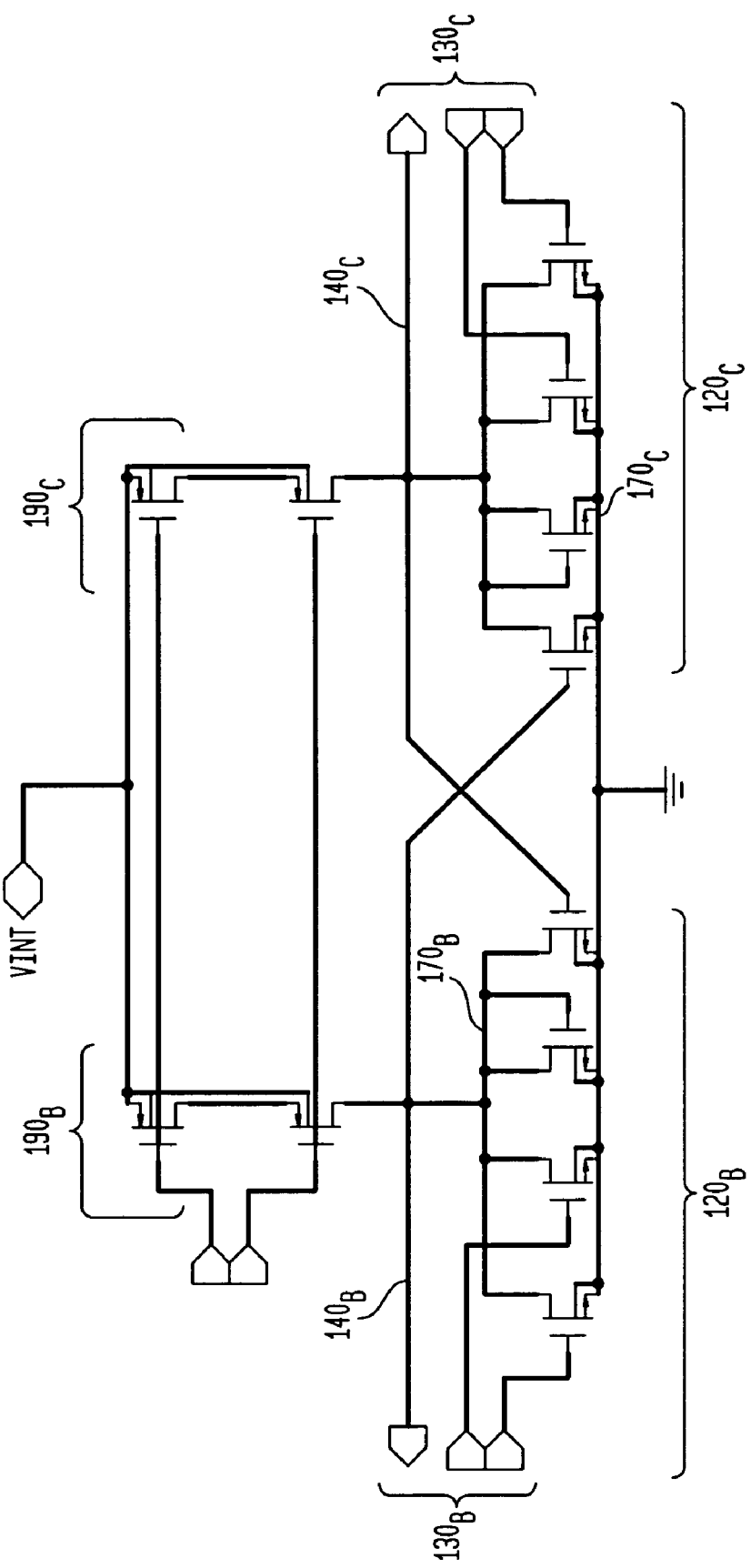
FIG. 4 is a circuit diagram illustrating exemplary cross-coupled stages of a multi-stage interconnected oscillator in accordance with the present invention.

FIG. 4 is a circuit diagram illustrating exemplary cross-coupled stages $120_B$ and $120_C$ of a multi-stage interconnected oscillator, having an even number of stages, in accordance with the present invention. Each stage $120_B$ and $120_C$ has three inputs, collectively illustrated as inputs $130_B$ and $130_C$, respectively, with one corresponding input also being a cross-coupled output (separately illustrated as outputs $140_C$ and $140_B$), with corresponding loads $170_B$ and $170_C$, and with corresponding current sources $190_B$ and $190_C$. As an example, three of these cross-coupled stages $120_B$ and $120_C$ may be utilized with a six stage interconnected oscillator of the present invention, with interconnections of outputs 140 to inputs 130 also determined through application of Equation 1, with some of the interconnections performed internally within the cross-coupled stage (rather than through the connection matrix 110). In a six stage oscillator, for example, with the interconnections of outputs 140 to inputs 130 of Equation 1, the adjacent stages $120_B$ and $120_C$ would represent stage numbers zero and three, or stage numbers one and four, or stage numbers two and five. In an eight stage oscillator, also for example, with the interconnections of outputs 140 to inputs 130 of Equation 1, the adjacent stages $120_B$ and $120_C$ would represent stage numbers zero and four, or stage numbers one and five, or stage numbers two and six, or stage numbers three and seven.

For purposes of understanding the present invention and its various embodiments, this specification provides the engineering foundation of the present invention, in the next four subsections, followed by application of these equations and derivations to the various interconnected oscillator embodiments of the invention.

2. Dynamics of Interconnected Inverters:

In accordance with the present invention, a broad class of interconnected oscillators 100 are defined as consisting of a plurality "N" of interconnected inverting gain stages 120, with each inverting gain stage consisting of a plurality "x" of interconnected input transistors (or equivalent inverters or amplifiers) (e.g., transistors 160 of FIG. 3) (in addition to any current sourcing transistors). For these interconnected oscillators of the present invention, a linearized differential equation for node voltages, referred to herein as "Equation 1", with each node being an output from a given inverting gain stage, for any $n^{th}$ stage (i.e., any given or selected stage), may be written substantially as:

$$C\frac{dV_n}{dt} = -\sum_{j=0}^{N-1} g_j V_{n-j} = -\sum_{j=0}^{N-1} g_{n-j} V_j. \quad (1)$$

where C is the capacitance for each node, "j" is the index of summation and also refers to a transistor number within each stage, $V_{(n-j)}$ is a voltage of a $(n-j)^{th}$ output node, $g_j$ is the transconductance of the $j^{th}$ input transistor (i.e., $g_j$ is the transconductance whereby (using the first summation of Equation 1) node (n−j) drives current into node n, or more particularly, whereby the $(n-j)^{th}$ node is coupled to the $n^{th}$ node (via a corresponding $j^{th}$ transistor)). Using known numbering conventions, n refers to the stage number (e.g., n= 0 is a first stage, n=7 is an eighth stage, and so on), and j is the input transistor number within a given stage (e.g., j=0 is a first transistor, j=3 is a fourth transistor, and so on). The term $g_0$, which will be further discussed below, represents the load on each node, or its conductance to ground, depending upon the node number and the oscillator configuration. The indices of equation 1 "wrap around" modulo N so that, for example, $V_{-n}$ refers to the same node as $V_{N-n}$. As indicated above, the invention utilizes an interconnection methodology for the array of inverting gain stages which is symmetrical with respect to the node number.

While illustrated in Equation 1 as two equalities, it should be understood that $$-\sum_{j=0}^{N-1} g_j V_{n-j}$$

and $$-\sum_{j=0}^{N-1} g_{n-j} V_j$$

are equivalent notations having the same meaning in modulo N.

The Discrete Fourier Transform (DFT) of the node voltages is:

$$U_k = \sum_{n=0}^{N-1} V_n e^{2\pi i \frac{nk}{N}} \quad (2)$$

with the inverse transform of:

$$V_n = \frac{1}{N} \sum_{k=0}^{N-1} U_k e^{-2\pi i \frac{nk}{N}}. \quad (3)$$

The quantities $U_k$ are coefficients for the modes of the oscillator. In each mode, there is a constant phase shift when going from one node (output 140) to the next. For a mode of index k, Equation 3 shows that this phase shift is $-2\pi k/N$.

In transforming Equation 1 into DFT domain, the convolution of the right hand side of the equation will become a product in the transformed equation, and by multiplying both sides by exp($2\pi ink/N$), summing over n, and using Equation 2, results in:

$$C\frac{dU_k}{dt} = -\sum_{n=0}^{N-1}\sum_{j=0}^{N-1} g_j V_{n-j} e^{2\pi i \frac{nk}{N}}. \quad (4)$$

Substituting Equation 3 (with a change in dummy variable of summation) into Equation 4 results in:

$$C\frac{dU_k}{dt} = -\frac{1}{N}\sum_{n=0}^{N-1}\sum_{j=0}^{N-1} g_j \left(\sum_{p=0}^{N-1} U_p e^{-2\pi i \frac{(n-j)p}{N}}\right) e^{2\pi i \frac{nk}{N}} \quad (5)$$

-continued $$= -\sum_{j=0}^{N-1}\sum_{p=0}^{N-1} g_j U_p e^{2\pi i \frac{jp}{N}} \left( \frac{1}{N}\sum_{n=0}^{N-1} e^{2\pi i \frac{(k-p)n}{N}} \right).$$

Summing Equation 5 over n results in the term in parentheses equaling 1 when k=p and is zero otherwise, and followed by summing over p results in uncoupled equations for the mode coefficients:

$$C\frac{d}{dt}U_k(t) = -U_k(t)\left(\sum_{j=0}^{N-1} g_j e^{2\pi i \frac{jk}{N}}\right). \tag{6}$$

In Equation 6, the bracketed term is the DFT of the transconductances, which may be written as:

$$\frac{d}{dt}U_k(t) = -\omega_T \Gamma_k U_k(t) \tag{7}$$

where $$\omega_T = \frac{g_T}{C}, \tag{8}$$

$$g_T = \sum_{j=0}^{N-1} g_j, \tag{9}$$

$$\Gamma_k = \sum_{j=0}^{N-1} G_n e^{2\pi i \frac{jk}{N}}, \tag{10}$$

and $$G_n = \frac{g_n}{g_T}. \tag{11}$$

As a consequence, all the transconductances $g_n$ may be normalized with respect to the total transconductance of each stage $g_T$. The sum of the normalized transconductances $G_n$ equals 1, such that using Equation 10, $$\Gamma_0 = 1. \tag{12}$$

(Alternatively, the term $g_0$ may be utilized as a relative, basic unit of transconductance, such that other transconductances may be expressed and normalized in terms of $g_0$, with corresponding changes in the equations which follow).

The solution to Equation 7 is then $$U_k(t) = U_k(0)e^{-\Gamma_k \omega_T t}, \tag{13}$$

which may then be expressed as $$U_k(t) = U_k(0)e^{-\alpha_k t + i\omega_k t}, \tag{14}$$

where $\alpha_k$ and $\omega_k$ are real numbers representing, respectively, the attenuation and the oscillation frequency of the $k^{th}$ mode. As a consequence, $$\alpha_k = \omega_T Re\Gamma_k \text{ and}$$

$$\omega_k = -\omega_T Im\Gamma_k. \tag{15}$$

For sustained oscillation, a mode must satisfy $\alpha_k = 0$. If we consider the case when only one mode of oscillation is present in the oscillator, although there are N functions $U_k(t)$, these functions are not all independent. Because the node voltages $V_n$ are real numbers, Equation 2 implies that $$U_k(t) = U^*_{N-k}(t). \tag{16}$$

Similarly, since the $g_n$ are real, from Equation 10, $\Gamma_k = \Gamma^*_{N-k}$, then $$\alpha_k = \alpha_{N-k}.$$

$$\omega_k = -\omega_{N-k} \tag{17}$$

It follows from Equation 16, therefore, that there are only $\lfloor N/2 \rfloor$ independent modes, where the notation $\lfloor \ \rfloor$ means that N/2 is to be rounded down for odd N. From Equation 3, the equation for sustained single-mode oscillation is $$V_n(t) = \frac{1}{N}\left(U_k(0)e^{i\omega_k t}e^{-2\pi i \frac{nk}{N}} + U_k^*(0)e^{-i\omega_k t}e^{2\pi i \frac{nk}{N}}\right) \tag{18}$$

$$= A_k \cos\left[\omega_k t + \phi_k - 2\pi\frac{nk}{N}\right]$$

where $A_k$ and $\phi_k$ are real numbers satisfying $$U_k(0) = \frac{A_k}{2N}e^{i\phi_k}. \tag{19}$$

Equation 18 implies that whether the phase increases or decreases with increasing n depends on whether $\omega_k$ is positive or negative, respectively. Because the cosine function is even, and given the symmetry of all the coefficients in Equation 18, it is apparent that a positive frequency mode k is indistinguishable from a negative frequency mode N−k.

If we assume that the oscillating mode is the mode with k=d, then $$Re\Gamma_d = 0, \tag{20}$$

which is the "Barkhausen Criterion" for this oscillator. For the oscillator to perform as intended, when the fundamental mode satisfies Equation 20, all other modes should have a positive attenuation factor ($\alpha_k > 0$). When the oscillator starts up, the fundamental mode grows in amplitude until it reaches a steady-state value. Initially, the fundamental mode will have gain ($\alpha_d < 0$), and when the amplitude of the fundamental mode becomes large enough, the gain will saturate. As a consequence, we may assume that all the coefficients $G_k$ decrease by the same factor in saturation, except for the coefficient $G_0$ representing the load transistor or device, as is the case when the transconductance $g_0$ is implemented as a diode-connected transistor, as illustrated in FIGS. 3 and 4.

Given an arbitrary set of coefficients, the first step in determining the performance of the oscillator is to determine which mode will oscillate. This may be done by computing all values of $\alpha_k/\omega_T$ from Equation 15 and selecting a minimum value (smallest absolute value), which should be negative to support oscillation. Equation 20 may then be solved to eliminate $G_0$, $$G_0 = -\sum_{n=1}^{N-1} G_n \cos\frac{2\pi nd}{N}. \quad (21)$$

Equation 12 then becomes $$\sum_{n=1}^{N-1} G'_n\left(1-\cos\frac{2\pi nd}{N}\right) = 1. \quad (22)$$

Although the exact factor by which the gain will compress may be unknown, the frequencies and attenuations may be expressed, using Equations 11, 15, 21 and 22, as:

$$\frac{\omega_k}{\omega_T} = \frac{\sum_{n=1}^{N-1} g_n \sin\frac{2\pi nk}{N}}{\sum_{n=1}^{N-1} g_n\left(\cos\frac{2\pi nd}{N} - 1\right)} \quad (23)$$

and $$\frac{a_k}{\omega_T} = \frac{\sum_{n=1}^{N-1} g_n\left(\cos\frac{2\pi nd}{N} - \cos\frac{2\pi nk}{N}\right)}{\sum_{n=1}^{N-1} g_n\left(\cos\frac{2\pi nd}{N} - 1\right)}. \quad (24)$$

The value of the load conductance during oscillation may then be expressed as:

$$g_0 = -\sum_{n=1}^{N-1} g_n \cos\frac{2\pi nd}{N}. \quad (25)$$

These expressions are useful for calculations, as they are unaffected if all the elements $g_n$ are multiplied by a constant, thereby allowing use of arbitrarily scaled values for them, and especially allowing arbitrarily scaled values of relative sizes of the transistors used to implement the gain elements (stages).

3. Design Optimization of the Oscillator of the Present Invention:

As a design criterion for the oscillator 100, it is desirable that all the undesired modes have a specified minimum attenuation $\alpha$, so that $\alpha_k \geq \alpha$, for k ≠ d. Using Equations 10, 12, 15 and 20, this design criterion implies the following relations:

$$\frac{\omega_d}{\omega_T} = -\sum_{n=1}^{N-1} G_n \sin\frac{2\pi nd}{N}, \quad (26)$$

for the oscillation frequency of the desired mode in terms of circuit parameters;

$$\sum_{n=0}^{N-1} G_n \cos\frac{2\pi nd}{N} = 0, \quad (27)$$

as a condition for oscillation; and $$\sum_{n=0}^{N-1} G_n \cos\frac{2\pi nk}{N} \geq a, \ 0 < k \leq \lfloor N/2 \rfloor, k \neq d, \quad (28)$$

and $$\sum_{n=0}^{N-1} G_n = 1 \quad (29)$$

for attenuation of the undesired modes, where the quantity $a = \alpha/\omega_T$ is the attenuation of the undesired modes relative to the frequency parameter $\omega_T$. Because of the symmetry of the attenuation coefficients (from Equation 17), there are only $\lfloor N/2 \rfloor$ independent constraints on $G_n$ in Equations 27 and 28 (inequality).

To provide for a maximum oscillation frequency, $\omega_d/\omega_T$ of Equation 26 is maximized subject to the constraints of Equations 27, 28 and 29. Since $\omega_T$ depends on $g_T$, this maximization is under the assumption that the total transconductance per stage ($g_T$) and the capacitance per stage (node) C are fixed, while we are free to vary the other transconductances $g_n$ over all positive values consistent with a constant sum. (Alternatively and equivalently, rather than holding the total transconductance per stage fixed, the load device $g_0$ may be held constant, with different results for oscillation frequencies and attenuations). Because the unknown coefficients $G_n$, are non-negative, this optimization may be solved through linear programming methodology. The oscillator may also be optimized by forcing specific transconductances to zero, providing for dispensing with one or more interconnections without a significant change in oscillation frequency. An exemplary programming methodology is illustrated in FIG. 7, written using Mathematica, and which calculates the optimum solution using a ConstrainedMax function (which uses the Simplex method), providing a global maximum of $\omega_d/\omega_T$ subject to the given constraints. Discussions of linear programming and the simplex method may be found in W. H. Press et al., Numerical Recipes in C (Cambridge University Press 1992, ISBN: 0-521-43108-5), at 430.

4. Exact Solution for the Optimum Configuration:

Exact solutions to Equations 27 through 29 may be found, with the inequality of Equation 28 taken as an equality when the oscillating mode d=1. In this case, there are $\lfloor N/2 \rfloor + 1$ linear equations to solve. When only $\lfloor N/2 \rfloor + 1$ coefficients are nonzero, then there is an analytical solution for nonzero values of $G_n$, as a function of the parameters N and a. For even N, this solution is:

$$G_{n+\frac{N}{2}} = \frac{2}{N}\left(1 - a + 2a\cos\left(\frac{2\pi n}{N}\right)\right), n = 1, 2, \ldots, \frac{N}{2} - 1, \quad (30)$$

and $$G_{N/2} = \frac{1}{N}(1 + a), \quad (31)$$

with $G_n=0$ for $0<n<N/2$. For odd N, the values of $G_n$ are:

$$G_{n+\frac{N+1}{2}} = \frac{2}{N}\left(1 - a + 2a\cos\left[(2n+1)\frac{\pi}{N}\right]\right), n = 0, 1, \ldots, \frac{N-3}{2} \quad (32)$$

with $G_n=0$ for $0<n<(N+1)/2$. For either even or odd N, the value of $G_0$ is:

$$G_0 = \frac{1}{N}(1 + (N-3)a). \quad (33)$$

The frequency of the fundamental mode is found by substituting these expressions for $G_n$ into Equation 26 and simplifying, resulting in Equation 34 (divided into 34(a) and 34(b) for even and odd N, respectively):

$$\frac{\omega_1}{\omega_T} = \frac{2(1-a)}{N\tan\left(\frac{\pi}{N}\right)}, \quad (34(a))$$

for even N, and $$\frac{\omega_1}{\omega_T} = \frac{1-a}{N\tan\left(\frac{\pi}{2N}\right)} + \frac{a}{N}\tan\left(\frac{\pi}{N}\right), \quad (34(b))$$

for odd N.

An upper limit to the oscillator frequency, $\omega_{max}$, may be found in the limit when a approaches zero, providing Equation 35 (also divided into 35(a) and 35(b) for even and odd N, respectively):

$$\frac{\omega_{max}}{\omega_T} = \frac{2}{N\tan\left(\frac{\pi}{N}\right)}, \quad (35(a))$$

for even N, and $$\frac{\omega_{max}}{\omega_T} = \frac{1}{N\tan\left(\frac{\pi}{2N}\right)}, \quad (35(b))$$

for odd N.

An exemplary table, provided below, illustrates oscillator frequencies $\omega_{max}/\omega_T$ and $\omega_1/\omega_T$, for a=0.05, as a function of the number of stages N. It should be noted that other, corresponding determinations may be made equivalently for other assumptions of a and N.

| N | $\omega_{max}/\omega_T$ | $\omega_1/\omega_T$, for a = 0.05 |
| --- | --- | --- |
| 3 | 0.57735 | 0.57735 |
| 4 | 0.5 | 0.475 |
| 5 | 0.615537 | 0.592025 |
| 6 | 0.57735 | 0.548483 |
| 7 | 0.625898 | 0.598043 |
| 8 | 0.603553 | 0.573376 |
| 9 | 0.630142 | 0.600657 |
| 10 | 0.615537 | 0.58476 |
| 11 | 0.632287 | 0.602007 |
| 12 | 0.622008 | 0.590908 |
| 13 | 0.633519 | 0.602791 |
| 14 | 0.625898 | 0.594603 |
| 15 | 0.634291 | 0.603285 |
| 16 | 0.628417 | 0.596997 |
| 31 | 0.636075 | 0.604435 |
| 32 | 0.634573 | 0.602844 |
| 10,000 | 0.63662 | 0.604789 |
| 10,001 | 0.63662 | 0.604789 |

Observing the results illustrated in the table above, for N=3, the optimum solution reduces to a 3-stage ring oscillator with one input per stage, with $\omega_1/\omega_T=1/3$, independent of a, resulting in $\omega_1=\omega_{max}$. As illustrated, oscillator speed (frequency) is higher for odd N, compared to even N. For odd N, using Equation 35(b), $\omega_{max}(2N)=\omega_{max}(N)$, indicating that the number of stages of an even-N oscillator should be doubled to approach the performance of an odd-N oscillator. Nevertheless, for appropriately large N, the optimum solution allows oscillator performance of multi-phase oscillators to exceed the per-stage efficiency of a 3-stage ring oscillator. For very large N, the advantage of an odd number of stages N, compared to an even number of stages N, diminishes as $\omega_{max}/\omega_T$ approaches $2\pi$.

An oscillator may be designed by specifying how close $\omega_1$ approaches $\omega_{max}$, i.e., specifying the ratio $\omega_1/\omega_{max}$, and solving for a using Equations 34 and 35, resulting in Equation 36 (divided into 36(a) and 36(b) for even and odd N, respectively):

$$a = 1 - \frac{\omega_1}{\omega_{max}}, \quad (36(a))$$

for even N, and $$a = \frac{1 - (\omega_1/\omega_{max})}{2 - \sec\frac{\pi}{N}}, \quad (36(b))$$

for odd N.

It may be observed that the calculations for the maximum frequency using the simplex method agree with the results of Equation 34.

In satisfying the constraints of Equation 28 for the attenuation of the undesired modes, an inverse proportionality between attenuation and frequency may be observed, such that the higher the attenuation, the lower the maximum frequency. The analytical solution has the same attenuation a for all undesired modes (except mode 0, which has a fixed attenuation of $\alpha_0 = \omega_T$, and as a consequence, other solutions may provide for one or more modes with greater attenuation. Given the trade-off between fast oscillation and greater attenuation of undesired modes, it is likely that the analytical solution, which minimally obeys the attenuation constraints, is in fact the global optimum.

Using the simplex method of FIG. 7, various solutions may be found which have the same maximum frequency, but differ with regard to the values of the coefficients $G_n$, (the transconductance of a $n^{th}$ transistor normalized to the total transconductance of the stage). In some cases, more of the $G_n$ coefficients are zero, and some attenuations are greater than a, thereby providing promising oscillator designs having fewer inputs per stage.

5. Design Considerations:

Since the frequencies and attenuations that characterize the oscillator may be calculated using scaled or normalized values of the gain coefficients (transconductances $g_n$) (Equations 11 and 15), it is convenient to scale them so that their sum represents the total width of all the transistors used in each gain stage $g_T$, which are normalized as $G_n$. Each $G_n$ may then be multiplied by $g_T$ to provide the size of each transistor per stage, as specified by its transconductance, resulting in the optimum size for each transistor in the particular stage 120 (delay cell) of the oscillator 100.

Equations 34(a) and 34(b) for the oscillation frequency (in even and odd N cases), although superficially different, have similar dependencies on a and N. In each equation, the oscillation frequency increases with N, and in the limit of large N becomes a constant. This contrasts sharply with the case of singly interconnected ring oscillators of the prior art, where the oscillation frequency decreases as more stages are added.

In addition, oscillation frequency increases as a decreases, where $a = \alpha/\omega_T$ is the attenuation of the undesired modes relative to the frequency parameter $\omega_T$. Suppression of the undesired modes is at the expense of the higher frequency (speed) of the fundamental mode. The choice of a depends most importantly on its effect on the variation in the gains, as shown in Equations 30 through 32. As the relative attenuation a decreases, the variations in gain among the stages become a smaller percentage of their average value. When fabricating an oscillator, however, these gains are varied by adjusting the size of each of the transistors in each stage, which is limited in its resolution by the selected fabrication process technology. For very small values of a, errors in rounding the ideal calculated gain values by the process resolution, as well as errors resulting from process variations, may produce undesired and significant errors in oscillator frequencies and in the damping of the undesired modes. As a consequence, the design process typically requires a trade-off in which a is made as small as possible consistent with the achievable fabrication tolerance, which, of course, will vary as new fabrication techniques are introduced.

Figure 5B:
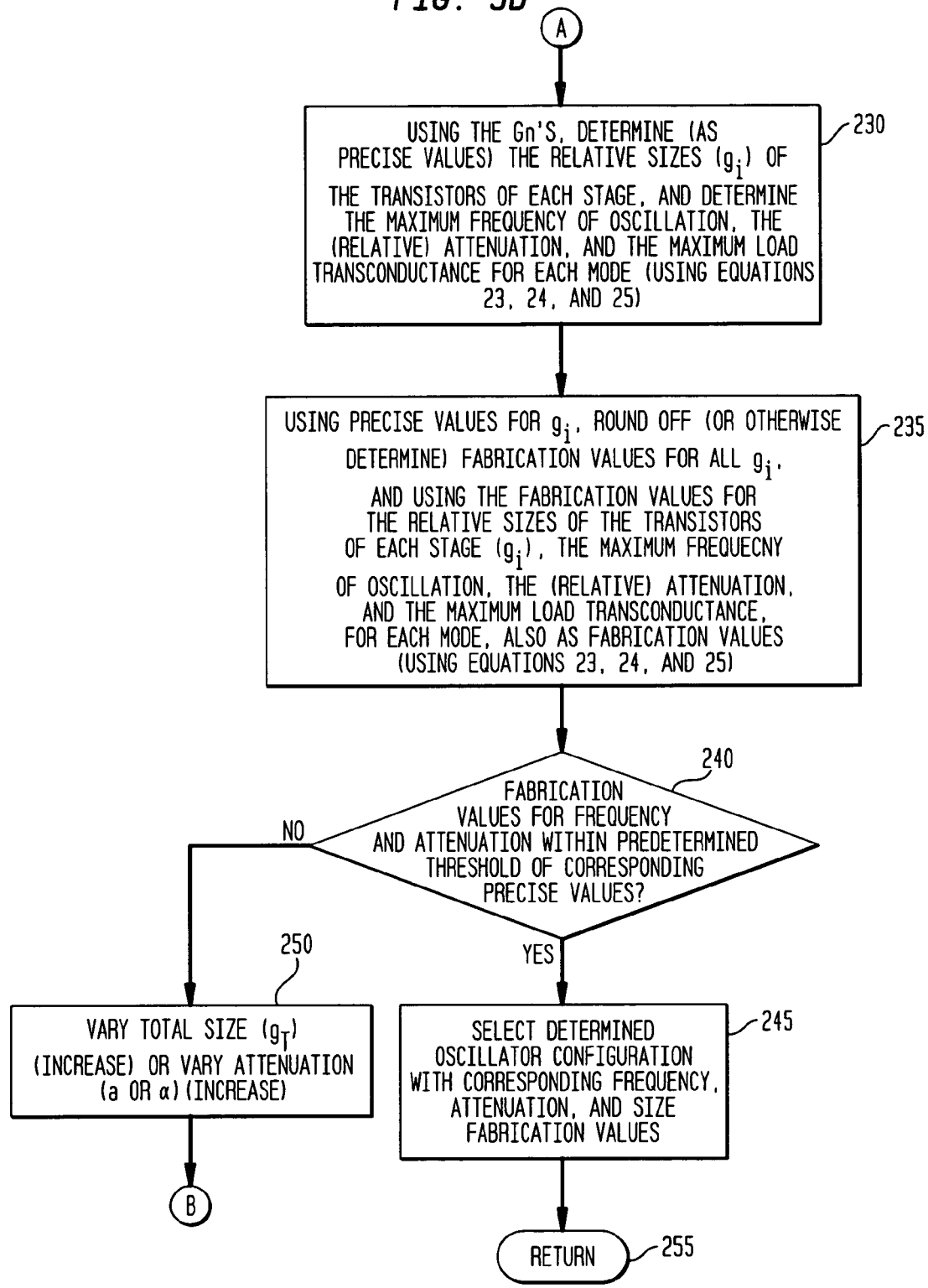
FIG. 5 is a flow diagram illustrating a first method embodiment for designing and modeling a multi-stage interconnected oscillator in accordance with the present invention.

6. Exemplary Methodology of Oscillator Design and Modeling:

FIG. 5 is a flow diagram illustrating a first method embodiment for designing and modeling a multi-stage interconnected oscillator in accordance with the present invention. The first method embodiment illustrated in FIG. 5 is implemented through the exemplary program illustrated in FIG. 7 (sections 7A and 7B). The first method embodiment uses Equations 26 through 29, and using the relations of Equations 8 through 12, while the second method embodiment, illustrated in FIG. 6, uses the exact solutions of Equations 30 through 35, and also using the relations of Equations 8 through 12. The second method embodiment illustrated in FIG. 6 is also implemented through the exemplary program illustrated in FIG. 7 (sections 7C and 7B).

Referring to FIG. 5, the method begins, start step 200, with specification of the total number "N" of stages "n" for the desired or selected oscillator, step 205; and specification of the minimum attenuation $\alpha$ of undesired modes (or, equivalently, specification of the ratio "a" of $a=\alpha/\omega_T$), step 210. Alternatively in step 210, the desired frequency ratio $\omega_1/\omega_T$ may be specified, with a and $\alpha$ then determined derivatively through Equation 34. In step 215, the total transconductance $g_T$ of all of the input transistors per stage to be utilized in the oscillator is specified, i.e., the total sum of all the individual transconductances of the input transistors, per stage, step 215. As indicated above, the total transconductance may be provided as a scaled factor.

Next, using Equation 8, the method determines the normalized frequency $\omega_T$ as $\omega_T = g_T/C$, where $g_T$ is a total transconductance per stage and C is the capacitance on each node, step 220. In step 225, using Equation 26, the method then maximizes the frequency of the fundamental mode, as $$\frac{\omega_d}{\omega_T} = -\sum_{n=1}^{N-1} G_n \sin\frac{2\pi nd}{N},$$

and determines the normalized transconductances $G_n$ (gains) for each individual $n_{th}$ input transistor of the stage which provide this maximum frequency, (or equivalently, as $G_n = g_n/g_T$, where $g_n$ is the transconductance of the $n^{th}$ transistor of the stage), subject to the constraints of:

$$\sum_{n=0}^{N-1} G_n \cos\frac{2\pi nd}{N} = 0$$

(Equation 27 the conditions for oscillation), $$\sum_{n=0}^{N-1} G_n \cos\frac{2\pi nk}{N} \geq a, \, 0 < k \leq \lfloor N/2 \rfloor, k \neq d$$

(Equation 28, for the attenuation of the undesired mode), and $$\sum_{n=0}^{N-1} G_n = 1,$$

(Equation 29, as defined for a normalized transconductance), where $a=\alpha/\omega_T$ and d is the selected oscillation mode.

Using the normalized transconductances $G_n$, the relative sizes of the input transistors of each stage are determined (as $g_n$ or $g_j$), and using these comparatively precise size values, the maximum frequency (Equation 23), attenuation (Equation 24), and maximum load transconductance ($G_0$ or $g_0$) (Equation 25), for all modes, are calculated, also as comparatively precise values, step 230 (illustrated as the first output listings in FIGS. 8 through 11, and 13).

Continuing to refer to FIG. 5, the relative, precise sizes of the input transistors of each stage are rounded to sizes for fabrication, and using these fabrication size values for $g_n$, the method then determines the maximum frequency (Equation 23), attenuation (Equation 24), and maximum load transconductance ($G_0$ or $g_0$) (Equation 25), for all modes, as fabrication values, step 235 (also illustrated as the second output listings in FIGS. 8 through 11, and 13). Next, in step 240, using one or more predetermined criteria, such as minimum oscillation frequency and attenuation of undesired modes, the method determines whether there is a sufficient match between the fabrication values of step 235 and the more exact or precise values of step 230, such as whether the fabrication values are within a predetermined threshold of the precise values. Also for example, predetermined thresholds may be based upon criteria such as a sufficient ratio of the precise oscillation frequency to the fabrication oscillation frequency, whether any problematic modes have arisen, whether mode attenuation has changed significantly, and so on. If there is a sufficient match in step 240, the method then selects these fabrication size ($G_n$) values to form an oscillator configuration having acceptable or desired frequency, attenuation, and size characteristics, step 245, and the method may end, return step 255.

If there is not a sufficient match in step 240, i.e., the fabrication values are not within predetermined thresholds of the precise values, the method proceeds to step 250, and varies one or more input parameters, such as varying the total transconductance of the stage $g_T$ or varying the attenuation $\alpha$ (or a), generally increasing one of these input parameters. The method then iterates, returning to step 210 and performing all the calculations and modeling of steps 220 through 240, until an acceptable or desired solution is reached (or until the process is otherwise terminated). (It should be noted that the simplex method either reaches an acceptable, desired or potentially optimal solution or it indicates that it was unable to find a solution.)

FIG. 6 is a flow diagram illustrating a second, analytic method embodiment for designing and modeling a multi-stage interconnected oscillator in accordance with the present invention. The method begins, start step 300, with specification of the total number "N" of stages "n" for the oscillator, step 305; specification of the minimum attenuation $\alpha$ of undesired modes (or equivalently, "a" as equal to $\alpha/\omega_T$), step 310; and specification of the total transconductance $g_T$ of all of the input transistors per stage to be utilized in the oscillator, i.e., the total sum of all the individual transconductances of the input transistors, per stage, step 315 (which also may be provided as a scaled factor). Alternatively in step 310, as indicated above, the desired frequency ratio $\omega_1/\omega_T$ may be specified, with a and $\alpha$ then determined derivatively through Equation 34. Using Equation 8, the method determines the normalized frequency $\omega_T$ as $\omega_T = g_T/C$, where $g_T$ is a total transconductance of a given stage and C is the capacitance of each node, step 320.

Next, as determined in step 325, when N is even, the method proceeds to step 330, and when N is odd, the method proceeds to step 340. When N is even, in step 330, the method determines the normalized transconductance $G_n$, using Equations 30, 31 and 33, as $$G_{n+\frac{N}{2}} = \frac{2}{N}\left(1 - a + 2a\cos\left(\frac{2\pi n}{N}\right)\right), n = 1, 2, \ldots, \frac{N}{2} - 1,$$

and $$G_{N/2} = \frac{1}{N}(1 + a),$$

with $G_n = 0$ for $0 < n < N/2$, and with $$G_0 = \frac{1}{N}(1 + (N-3)a).$$

The method then determines the frequency of the fundamental mode (as a multiple of $\omega_T$), using Equation 34(a), as $$\frac{\omega_1}{\omega_T} = \frac{2(1-a)}{N\tan\left(\frac{\pi}{N}\right)},$$

step 335, and proceeds to step 350.

When N is odd, as determined in step 325, the method determines the nonzero values of the normalized transconductance $G_n$, using Equations 32 and 33, as $$G_{n+\frac{N+1}{2}} = \frac{2}{N}\left(1 - a + 2a\cos\left[(2n+1)\frac{\pi}{N}\right]\right), n = 0, 1, \ldots, \frac{N-3}{2}$$

with $G_n = 0$ for $0 < n < (N+1)/2$, and with $$G_0 = \frac{1}{N}(1 + (N-3)a),$$

step 340. The method then determines, in step 345, the frequency of the fundamental mode (as a multiple of $\omega_T$), using Equation 34(b), as $$\frac{\omega_1}{\omega_T} = \frac{1-a}{N\tan\left(\frac{\pi}{2N}\right)} + \frac{a}{N}\tan\left(\frac{\pi}{N}\right).$$

Following step 335 or step 345, in step 350, using the normalized transconductances $G_n$ determined in either step 330 or 340, the relative sizes of the input transistors of each stage are determined (as $g_n$), and using these comparatively precise size values, the maximum frequency (Equation 23) and attenuation (Equation 24) and for all modes are calculated, also as comparatively precise values, step 355 (also illustrated as the first output listings in FIGS. 12 and 14). It should be noted that in contrast with the method of FIG. 5, the frequency of the fundamental mode and the maximum load transconductance ($G_0$ or $g_0$) has already been determined in either step 335-40 or 345-50.

Continuing to refer to FIG. 6, the relative sizes of the input transistors of each stage are also rounded to sizes for fabrication, and using these fabrication size values for $g_n$, the method then determines the maximum frequency (Equation 23), attenuation (Equation 24), and load transconductance (Equation 25), for all modes, as fabrication values, step 355 (also illustrated as the second output listings in FIGS. 12 and 14). Next, in step 360, using one or more predetermined criteria, such as minimum oscillation frequency and attenuation of undesired modes and the other criteria discussed above, the method determines whether there is a sufficient match between the fabrication values of step 355 and the more exact or precise values of step 350, such as whether the fabrication values are within a predetermined threshold of the precise values. If there is a sufficient match in step 360, the method then selects these fabrication size ($G_n$) values to form an oscillator configuration having acceptable or desired frequency, attenuation, and size characteristics, step 365, and the method may end, return step 375.

If there is not a sufficient match in step 360, i.e., the fabrication values are not within predetermined thresholds of the precise values, the method proceeds to step 370, and varies one or more input parameters, such as varying the total transconductance of the stage $g_T$ or varying the attenuation $\alpha$ (or a), generally increasing one of these input parameters. The method then also iterates, returning to step 310 and performing all the calculations and modeling of steps 320 through 360, until an acceptable or desired solution is reached (or until the process is otherwise terminated).

The various oscillator design methodologies discussed above may be embodied in any number of forms, such as within a computer, within a workstation, or within any other form of computing or other system used to design or create integrated circuitry. The oscillator design methodologies may be embodied as any type of software, such as C++, C#, Java, or any other type of programming language, including the Mathematica program of FIG. 7 (and also may be directly performed by an individual without the aid of a computer). The oscillator design methodologies may be embodied within any tangible storage medium, such as within a memory or storage device for use by a computer, a workstation, any other machine-readable medium or form, or any other storage form or medium for use in a computing system to design or create integrated circuitry. Such storage medium, memory or other storage devices may be any type of memory device, memory integrated circuit ("IC"), or memory portion of an integrated circuit (such as the resident memory within a processor IC), including without limitation RAM, FLASH, DRAM, SRAM, MRAM, FeRAM, ROM, EPROM or $E^2$PROM, or any other type of memory, storage medium, or data storage apparatus or circuit, depending upon the selected embodiment. For example, without limitation, a tangible medium storing computer readable software, or other machine-readable medium, may include a floppy disk, a CDROM, a CD-RW, a magnetic hard drive, an optical drive, a quantum computing storage medium or device, a transmitted electromagnetic signal (e.g., a computer data signal embodied in a carrier wave used in internet downloading), or any other type of data storage apparatus or medium, and may have a static embodiment (such as in a memory or storage device) or may have a dynamic embodiment (such as a transmitted electrical signal), or their equivalents.

FIG. 7, divided into sections 7A, 7B, and 7C, illustrates an exemplary program implementing the method embodiments for designing and modeling a multi-stage interconnected oscillator in accordance with the present invention. The program of section 7A is utilized to calculate the acceptable or desired (or potentially optimal), relative sizes (each $G_n$) of the input transistors comprising each stage of the oscillator, using the simplex method (with Equations 26–29), based upon inputs of: the desired relative attenuation factor a (where $a=\alpha/\omega_T$) for the undesired, non-fundamental modes (input "a"), the total relative size of all the input transistors $g_T$ comprising each stage (input "sg"), and the total number of stages (input "n"). The non-zero, relative input transistor sizes are output, both as comparatively precise values and as rounded to the nearest whole number for fabrication, as illustrated in FIGS. 8 through 12.

The program of section 7C is utilized to calculate the acceptable or desired (or potentially optimal), relative sizes (each $G_n$) of the input transistors comprising each stage of the oscillator, using the exact solution of Equations 30–35), also based upon inputs of: the desired relative attenuation factor a (where $a=\alpha/\omega_T$) for the undesired, non-fundamental modes (input "a"), the total relative size of all the input transistors $g_T$ comprising each stage (input "sg"), and the total number of stages (input "n"). The non-zero, relative input transistor sizes may also be output, both as comparatively precise values and as rounded to the nearest whole number for fabrication, as illustrated in FIG. 13.

Using the $G_n$ information provided by the program of section 7A or 7C of FIG. 7 (or as separately input as whole number relative transistor sizes), the ("loop") program of section 7B is an exemplary program for calculating the results of Equations 23, 24 and 25, and is utilized to determine, for both the precise values and the fabrication values, the relative frequency (Equation 23), the relative attenuation a (Equation 24), and maximum load transconductance ($G_0$) (Equation 25), for each existing mode of oscillation for a stage having the relative input transistor sizes (output from section 7A (or 7C)). The precise values and the fabrication values, for each mode, are then provided as output for review, such as for the comparison procedures of step 245 or step 360, as discussed above. These programs (7A (or 7C) and 7B) may be performed iteratively, until the desired characteristics are modeled.

FIGS. 8 through 14 provide listings of the results of these programs. For each of these figures, the first paragraph provides the input parameters mentioned above; the second paragraph is the output listing for precise and fabrication values of $g_n$; the third paragraph is a table illustrating the relative frequency, the relative attenuation a, and maximum load transconductance ($G_0$), for each existing mode of oscillation for a stage having the relative input transistor sizes using the precise values; and the fourth paragraph is a table illustrating the relative frequency, the relative attenuation a, and maximum load transconductance ($G_0$), for each existing mode of oscillation for a stage having the relative input transistor sizes using the fabrication values. While the present invention utilizes relative values for frequency, attenuation and transconductances, actual values may be obtained by extraction using other simulation techniques known in the art.

In the various embodiments, as mentioned above, the transconductance $G_n$ is related to the size of the (n-channel) input transistors. The relative input transistor sizes which are output may be considered multiples of a fundamental, relative unit, depending upon the desired fabrication. For purposes of example (using the convention that transistor length, rather than width, is the smaller dimension), a unit transistor size (a "stripe", as known in the art) may be 0.5 or 1.0 microns in width, with a specified length (e.g., 0.13 to 0.3 microns). The relative transistor sizes may be implemented by multiplying the relative size by the unit width, for the desired transistor size for fabrication. For example, with a unit transistor size of 1 micron, a relative sized transistor of 3 may be implemented as a transistor with 3 stripes of one micron (a width of 3 microns), and the same specified length, and so on, for the various relative transistor sizes. As a consequence, the transconductance $G_n$ may be viewed as a proxy for the width (or other size parameter) of the corresponding transistor(s).

FIG. 8 is a listing of the input parameters and corresponding output of the programs of FIG. 7 for a six stage oscillator in accordance with the present invention. Referring to FIG. 8, given a relative attenuation of 0.07, a total relative size of eleven, and six stages, an acceptable or desired stage has 3 transistors, of rounded (and precise) relative sizes of 2 (1.96), 4 (3.67) and 3 (3.15), with a relatively sized load of 2 (2.22). The relative frequency of the fundamental mode (m=1 in the listing) is 0.536936 for the precise value and 0.527146 for the fabrication value, which is reasonably close to the precise value, with the undesired modes having non-zero attenuations, ranging from about 0.08 to 1, also with the fabrication values being close to the precise values, and indicating a potentially acceptable design.

FIGS. 9, 10 and 11 are listings of the input parameters and corresponding outputs of the programs of FIG. 7 for an eight stage oscillator in accordance with the present invention. The varied inputs concern the total relative sizes of the transistors (11 or 19), and the degree of relative attenuation (0.07 or 0.25). FIG. 9 illustrates a problem which may arise in rounding values for fabrication. More particularly, the precise listing illustrates the fundamental mode with a relative frequency of 0.561305, and with all other, undesired modes having appropriate relative attenuations of 0.07, with mode 0 having an attenuation of 1.0 (which is the maximum relative for this technique). The fabrication values, however, illustrate that errors introduced from rounding may be catastrophic, with an undesired mode 6 having zero attenuation, indicating an unacceptable oscillator configuration. As a consequence, in accordance with the method illustrated in FIGS. 5 and 6, the variables of relative attenuation a or total size $g_T$ are varied to determine an acceptable oscillator design (FIGS. 10 and 11).

FIG. 10 illustrates increasing the sum of the sizes (or gains) $g_T$, while maintaining constant the relative attenuation a. As illustrated in the fabrication values, the undesired mode 6 is now acceptably attenuated, with a slight decrease in the relative frequency of the fundamental mode. FIG. 11 illustrates increasing the relative attenuation a while maintaining constant the sum of the sizes (or gains) $g_T$. As illustrated in the fabrication values, the undesired mode 6 is also now acceptably attenuated, but with a comparatively larger decrease in the relative frequency of the fundamental mode.

FIGS. 12, 13 and 14 are listings of the input parameters and corresponding output of the programs of FIG. 7 for a sixteen stage oscillator in accordance with the present invention, with FIG. 12 illustrating results using the (exact) Equations 30–35, and with FIG. 13 illustrating results using the simplex method to maximize $\omega_d/\omega_T$ of Equation 26 subject to the constraints of Equations 27–29. Comparing FIGS. 12 and 13 illustrates that both methods provide equally good, albeit different, 16-stage oscillator designs. For example, the design of FIG. 12 uses a relative size of the load $G_0$ of 5, compared to 8 in FIG. 13. More significantly, the design of FIG. 12 utilizes 8 inputs (transistors 8–15), whereas the design of FIG. 13 utilizes only 6 inputs with the precise values and only 5 inputs with the fabrication values (input 14 has been rounded to zero). Continuing to compare the values of FIG. 12 with those of FIG. 13, with respect to the precise values, the two designs nonetheless have the same relative frequency of the fundamental mode, and with respect to the fabrication values, the two designs have very close relative frequencies of the fundamental mode and similar attenuation of the undesired modes.

In FIG. 14, to follow on from the 6 input per stage design of FIG. 13, the simplex methodology is also utilized, but with 2 of the 16 possible transistors per stage forced equal to zero during optimization (noConnect). This variation resulted in a 16-stage, 4 input oscillator, with a slightly decreased relative frequency of the fundamental mode.

Figure 15:
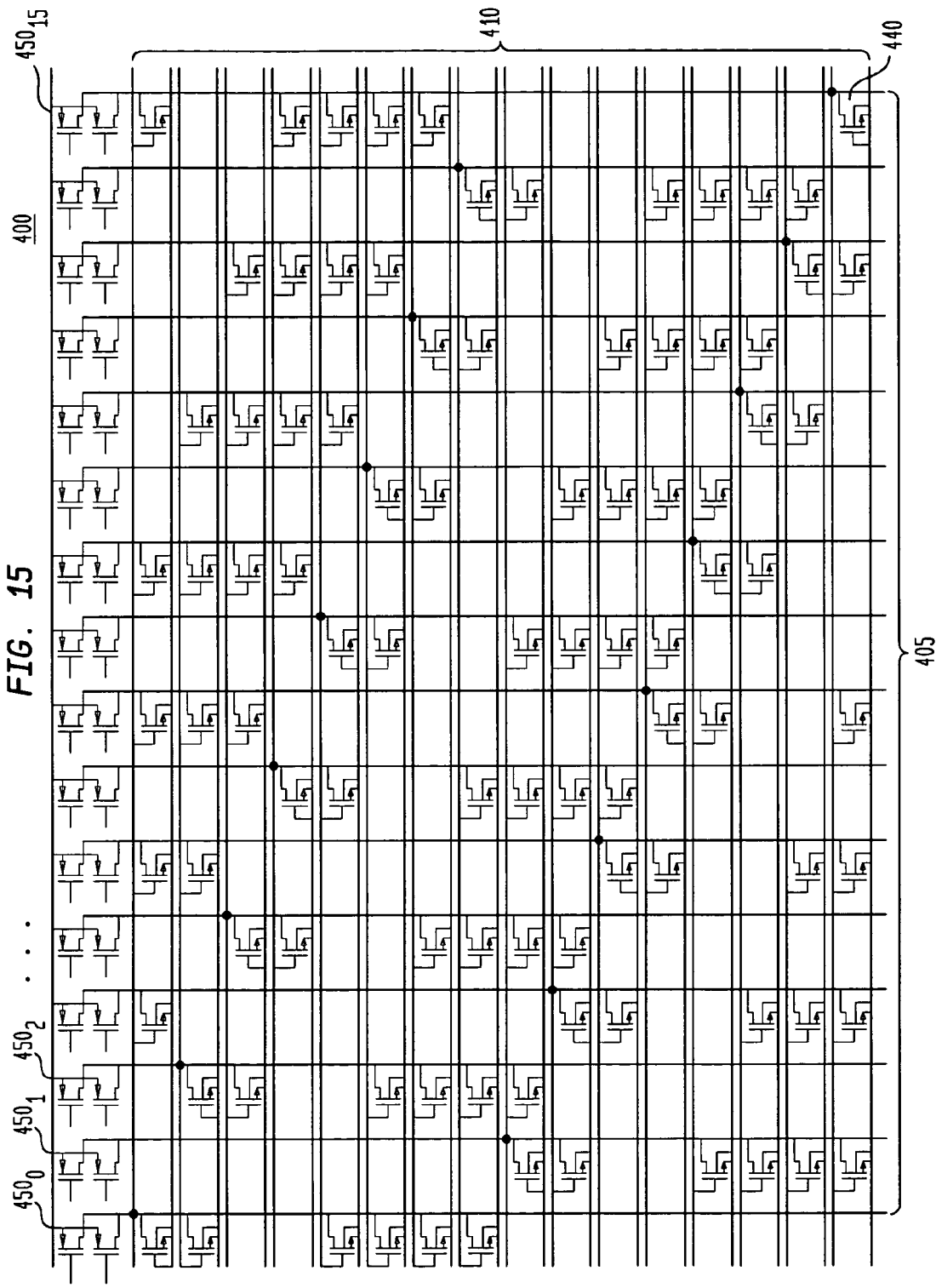
FIG. 15 is a circuit diagram illustrating an exemplary sixteen stage, 5 input per stage oscillator in accordance with the present invention.

FIG. 15 is a circuit diagram illustrating an exemplary sixteen stage, 5 input per stage oscillator 400 in accordance with the present invention, implemented using the fabrication values of FIG. 13. The output nodes are illustrated on the (vertical) output interconnects 405, with input coupling (to the output interconnects 405) occurring via (horizontal) input interconnects 410, for each stage 450$_0$ through 450$_{15}$. Extra transistors (such as transistor 440) are also illustrated, solely for potential use in the future as load devices. As illustrated, these load transistors $G_0$ are not utilized, as there is already sufficient parasitic loading within the circuit and, separate capacitive devices are also not utilized, as there is sufficient parasitic capacitance within the circuit. In simulation, by varying $g_T$, the frequency of the fundamental mode of the oscillator 400 was varied from 500 MHz to 2 GHz.

Figure 16:
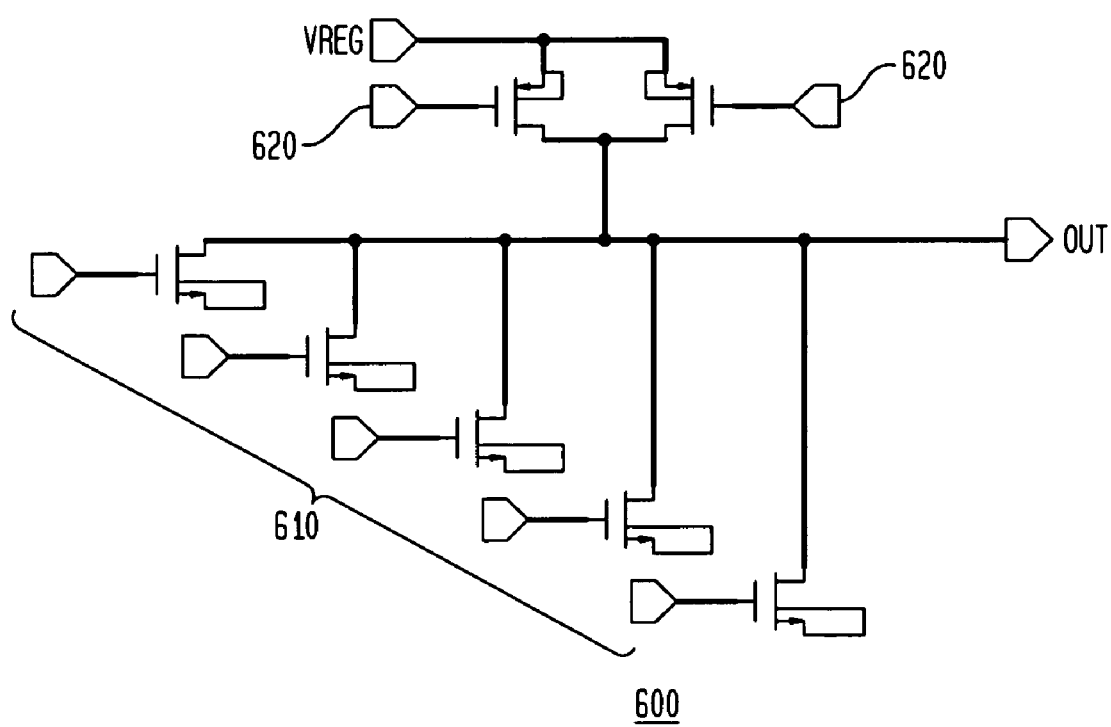
FIG. 16 is a circuit diagram illustrating an exemplary stage having five inputs, for a multi-stage oscillator in accordance with the present invention.

FIG. 16 is a circuit diagram illustrating an exemplary stage 600 having five inputs 610, for a multi-stage oscillator in accordance with the present invention, such as for the 16-stage oscillator of FIG. 15. Varying the bias voltage applied to inputs 620 provides proportional changes in the gains of the transistors 610 and provides for tuning of the oscillator 600. As in FIG. 15, separate load transistors $G_0$ are not utilized, as there is already sufficient parasitic loading within the stage 600 and, separate capacitive devices are also not utilized, as there is sufficient parasitic capacitance within the stage 600.

FIG. 17 is a listing of the input parameters and corresponding output of the programs of FIG. 7 (in accordance with the present invention) for the prior art oscillator of the Sun patent. The first two paragraphs provide an optimum solution, in accordance with the present invention, for n=5, d=1, a=0.07 and a total size parameter of sg=24, as precise values, with a resulting $\omega_{max}$ of 0.615537. In contrast, using the 5-stage, 2-input per stage arrangement of the Sun patent, output listings are provided for the varied sub-loop gains (8, 12 and 25) (output listings of paragraphs 3, 4 and 5, respectively), in accordance with the Sun invention, which varies the transistor gains separately from each other. As determined by the loop program, the variation in the sub-loop gains results in catastrophic instability, with mode 3 (rather than mode 1) becoming the dominant mode for a sub-loop gain of 12 (paragraph 4), and with mode 2 (rather than mode 1) becoming the dominant mode for a sub-loop gain of 25 (paragraph 4). This contrasts sharply with the present invention, which provides for variation of $g_T$ and corresponding variation of transistor gains only in proportion to each other (not separate or independent variation of each transistor gain) to vary the relative frequency while maintaining the same relative attenuation.

Figure 18:
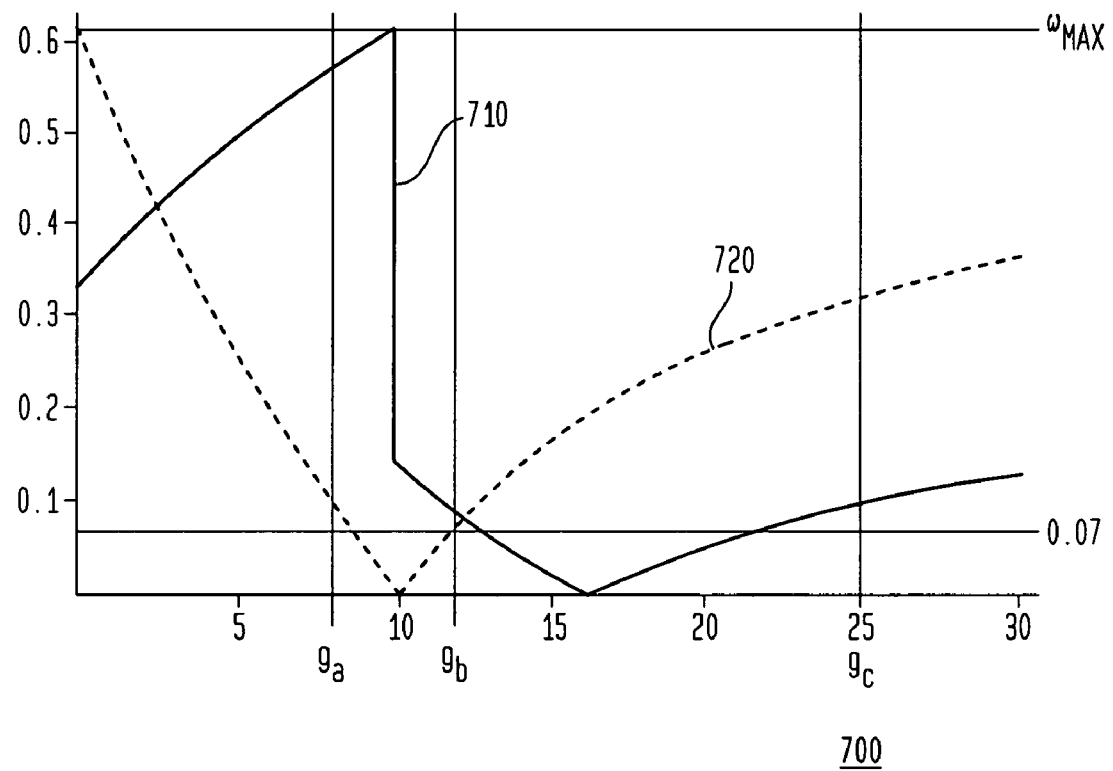
FIG. 18 is a graphical diagram of attenuation and frequency versus sub-loop gain for the prior art oscillator of the Sun patent.

FIG. 18 is a graphical diagram 700 of relative attenuation and relative frequency (ordinate axis) versus sub-loop gain (abscissa) for the prior art oscillator of the Sun patent, also illustrating catastrophic instability with variation of the sub-loop gains. The bold curve (710) illustrates the frequency of the dominant mode and the dashed curve (720) illustrates attenuation of the non-dominant mode. As sub-loop gain increases, the dominant mode changes from mode 1 to mode 3, and then to mode 2, at the points of discontinuity in the slope of the frequency. Above the sub-loop gain of 10, the undesired modes are dominant, with curve 720 then representing attenuation of the desired mode, mode 1. The vertical lines illustrate the cases for $g_a$, $g_b$, and $g_c$, of FIG. 17, with the horizontal lines marking the maximum frequency (calculated from Equation 35(b)) and the attenuation value of 0.07.

As may be apparent from the discussion above, the oscillator of the present invention may be designed to completely avoid instability problems. The present invention provides a consistent methodology both to guarantee stability of oscillation of a desired mode of oscillation, and to predict the dynamics of the oscillator in operation. In addition, the invention provides for an interconnected oscillator having a large number of interconnected stages and more than two inputs per stage, along with a design process to create such multi-stage interconnected oscillators having the desired stability characteristics. In addition, the invention provides for the ability to adjust frequencies of oscillation by increasing the number of stages employed and by varying various circuit parameters, such as load transconductances and transistor size.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An oscillator apparatus, the apparatus comprising:
a plurality of stages, each stage of the plurality of stages having an output node to form a plurality of output nodes;
each stage of the plurality of stages comprising a plurality of input transistors, the plurality of input transistors comprising at least three transistors, each transistor of the plurality of input transistors having an input to form a corresponding plurality of inputs for each stage; and
wherein the plurality of stages are interconnected to provide an output node voltage $V_n$ for an $n^{th}$ stage, of the plurality of stages, in which substantially $$C\frac{dV_n}{dt} = -\sum_{j=0}^{N-1} g_j V_{n-j},$$

modulo N, wherein "N" is a total number of the plurality of stages, "j" is a transistor number of the plurality of input transistors within each stage, C is a capacitance of each output node, $g_j$ is a transconductance of $j^{th}$ transistor of the $n^{th}$ stage, and $V_{(n-j)}$ is a voltage of a $(n-j)^{th}$ output node of the plurality of output nodes.

2. The oscillator of claim 1, wherein for the $n^{th}$ stage, an input to the $j^{th}$ transistor, of the plurality of input transistors, is the coupled to the $(n-j)^{th}$ output node, and wherein (n-j) is determined modulo N.

3. The oscillator of claim 1, wherein for the $n^{th}$ stage, an input to a $(n-j)^{th}$ transistor, of the plurality of input transistors, is coupled to a $j^{th}$ output node of the plurality of output nodes, and wherein (n-j) is determined modulo N.

4. The oscillator of claim 1, wherein the plurality of stages comprises at least six stages (N=6).

5. The oscillator of claim 1, wherein a total number of input transistors per stage "x" is one-half of the total number "N" of the plurality of stages, for an even total number N of the plurality of stages, plus one for a load input transistor (x=(N/2)+1).

6. The oscillator of claim 1, wherein a total number of input transistors per stage "x", including any load transistor, is one-half of the total number "N" of the plurality of stages, rounded to a higher whole number, for an odd total number N of the plurality of stages (x=(N+1)/2).

7. The oscillator of claim 1, wherein the plurality of stages comprises at least eight (N=8), with each stage of the plurality of stages comprising at least four input transistors.

8. The oscillator of claim 1, wherein the plurality of input transistors of each stage of the plurality of stages are arranged to form an inverting gain stage.

9. The oscillator of claim 1, wherein the plurality of stages provide a corresponding plurality of output signals having a fundamental mode of oscillation at a selected frequency, with each output signal differing from the other output signals with respect to a phase difference of integer multiples of $2\pi/N$.

10. The oscillator of claim 9, wherein the selected frequency of the fundamental mode, for even N, is substantially equal to $$\frac{2(1-a)}{N\tan\left(\frac{\pi}{N}\right)}\omega_T,$$

wherein a normalized frequency parameter $\omega_T$ is proportional to a total transconductance per stage $g_T$ and inversely proportional to the capacitance C ($\omega_T = g_T/C$), and a relative attenuation parameter a is proportional to an attenuation $\alpha$ of undesired modes and inversely proportional to the frequency parameter $\omega_T$ (a=$\alpha/\omega_T$).

11. The oscillator of claim 9, wherein the selected frequency of the fundamental mode, for odd N, is substantially equal to $$\omega_T\left(\frac{1-a}{N\tan\left(\frac{\pi}{2N}\right)} + \frac{a}{N}\tan\left(\frac{\pi}{n}\right)\right)$$

wherein a normalized frequency parameter $\omega_T$ is proportional to a total transconductance per stage $g_T$ and inversely proportional to the capacitance C ($\omega_T = g_T/C$), and a relative attenuation parameter a is proportional to an attenuation a of undesired modes and inversely proportional to the frequency parameter $\omega_T$ ($a=\alpha/\omega_T$).

12. The oscillator of claim 9, wherein the selected frequency for the fundamental oscillation mode is substantially equal to $$-\omega_T \sum_{n=1}^{N-1} G_n \sin\frac{2\pi n}{N},$$

wherein "n" is a summation index, a normalized frequency parameter $\omega_T$ is proportional to a total transconductance per stage $g_T$ and inversely proportional to the capacitance C ($\omega_T = g_T/C$), and a normalized transconductance $G_n$ is directly proportional to a transconductance $g_n$ of a $n^{th}$ transistor of the plurality of input transistors and inversely proportional to a total transconductance $g_T$ of each stage of the plurality of stages ($G_n = g_n/g_T$).

13. The oscillator of claim 1, wherein for an even total number of the plurality of stages, pairs of adjacent stages of the plurality of stages are cross-coupled, with the output node of a first adjacent stage coupled to an input of a second adjacent stage, and with the output node of the second adjacent stage coupled to an input of the first adjacent stage.

14. The oscillator of claim 1, further comprising:
an interconnection matrix, coupled to the plurality of output nodes and selectively coupled to the plurality of inputs, for coupling a $(n-j)^{th}$ output node of the plurality of output nodes to $j^{th}$ input of the plurality of inputs for a $n^{th}$ stage.

15. An oscillator apparatus, the apparatus comprising:
a plurality of stages, the plurality of stages comprising at least six stages, each stage of the plurality of stages having an output node to form a plurality of output nodes;
a plurality of input transistors within each stage of the plurality of stages, each transistor having an input to form a plurality of inputs for each stage of the plurality of stages; and
wherein for a $n^{th}$ stage of the plurality of stages, the input to $j^{th}$ transistor, of the plurality of input transistors, is coupled to a $(n-j)^{th}$ output node of the plurality of output nodes, wherein (n-j) is determined modulo N where "N," is a total number of the plurality of stages, and wherein "j" is a transistor number of the plurality of input transistors within each stage.

16. The oscillator of claim 15, wherein the plurality of stages are interconnected to provide an output node voltage $V_n$ for the $n^{th}$ stage, of the plurality of stages, substantially of $$C\frac{dV_n}{dt} = -\sum_{j=0}^{N-1} g_j V_{n-j},$$

modulo N, wherein C is a capacitance of each output node, $g_j$ is a transconductance of a $j^{th}$ transistor of the $n^{th}$ stage, and $V_{(n-j)}$ is a voltage of a $(n-j)^{th}$ output node of the plurality of output nodes.

17. The oscillator of claim 15, wherein the plurality of input transistors comprises at least three transistors.

18. The oscillator of claim 15, wherein a total number of input transistors per stage "x" is one-half of the total number "N" of the plurality of stages, for an even total number N of the plurality of stages, plus one for a load input transistor (x=(N/2)+1).

19. The oscillator of claim 15, wherein a total number of input transistors per stage "x", including any load transistor, is one-half of the total number "N" of the plurality of stages, rounded to a higher whole number, for an odd total number N of the plurality of stages (x=(N+1)/2).

20. The oscillator of claim 15, wherein the plurality of stages comprises at least eight (N=8), with each stage of the plurality of stages comprising at least four input transistors.

21. The oscillator of claim 15, wherein the plurality of stages provide a corresponding plurality of output signals having a fundamental mode of oscillation at a selected frequency, with each output signal differing from the other output signals with respect to a phase difference of integer multiples of $2\pi/N$.

22. The oscillator of claim 21, wherein the selected frequency of the fundamental mode, for even N, is substantially equal to $$\frac{2(1-a)}{N\tan\left(\frac{\pi}{N}\right)}\omega_T,$$

wherein a normalized frequency parameter $\omega_T$ is proportional to a total transconductance per stage $g_T$ and inversely proportional to the capacitance C($\omega_T = g_T/C$), and a relative attenuation parameter a is proportional to an attenuation a of undesired modes and inversely proportional to the frequency parameter $\omega_T$ ($a=\alpha/\omega_T$).

23. The oscillator of claim 21, wherein the selected frequency of the fundamental mode, for odd N, is substantially equal to $$\omega_T\left(\frac{1-a}{N\tan\left(\frac{\pi}{2N}\right)} + \frac{a}{N}\tan\left(\frac{\pi}{n}\right)\right)$$

wherein a normalized frequency parameter $\omega_T$ is proportional to a total transconductance per stage $g_T$ and inversely proportional to the capacitance C($\omega_T = g_T/C$), and a relative attenuation parameter a is proportional to an attenuation $\alpha$ of undesired modes and inversely proportional to the frequency parameter $\omega_T$ ($a=\alpha/\omega_T$).

24. The oscillator of claim 21, wherein the selected frequency for the fundamental oscillation mode is substantially equal to $$-\omega_T \sum_{n=1}^{N-1} G_n \sin\frac{2\pi n}{N},$$

wherein "n" is a summation index, a no normalized frequency parameter $\omega_T$ is proportional to a total transconductance per stage $g_T$ and inversely proportional to the capacitance C ($\omega_T = g_T/C$), and a normalized transconductance $G_n$ is directly proportional to a transconductance $g_n$ of a $n^{th}$ transistor of the plurality of input transistors and inversely proportional to a total transconductance $g_T$ of each stage of the plurality of stages ($G_n = g_n/g_T$).

25. The oscillator of claim 15, wherein pairs of adjacent stages of the plurality of stages are cross-coupled, with the output node of a first adjacent stage coupled to an input of a second adjacent stage, and with the output node of the second adjacent stage coupled to an input of the first adjacent stage.

26. The oscillator of claim 15, further comprising:
an interconnection matrix, coupled to the plurality of output nodes and selectively coupled to the plurality of inputs, for coupling a $(n-j)^{th}$ output node of the plurality of output nodes to a $j^{th}$ input of the plurality of inputs for a $n^{th}$ stage.

27. An oscillator apparatus, the apparatus comprising:
a plurality of inverting gain stages, the plurality of inverting gain stages comprising at least six inverting gain stages, each inverting gain stage of the plurality of inverting gain stages having an output node to form a plurality of output nodes;
each inverting gain stage of the plurality of inverting gain stages comprising a plurality of input transistors, the plurality of input transistors comprising at least three transistors for each inverting gain stage of the plurality of inverting gain stages, each transistor of the plurality of input transistors having an input to form a plurality of inputs for each inverting gain stage of the plurality of inverting gain stages, the plurality of input transistors within each inverting gain stage having coupled drains to provide the output node for each inverting gain stage of the plurality of inverting gain stages; and
an interconnection matrix coupling a $(n-j)^{th}$ output node of the plurality of output nodes to $j^{th}$ input of the plurality of inputs of a $n^{th}$ inverting gain stage of the plurality of inverting gain stages, wherein (n−j) is determined modulo N where "N" is a total number of the plurality of inverting gain stages, and wherein "j" is a transistor number of the plurality of input transistors within each inverting gain stage.

28. The oscillator of claim 27, wherein the plurality of inverting gain stages are interconnected to provide an output node voltage $V_n$ for the $n^{th}$ stage, of the plurality of stages, substantially of $$C\frac{dV_n}{dt} = -\sum_{j=0}^{N-1} g_j V_{n-j},$$

modulo N, wherein C is a capacitance of each output node, $g_j$ is a transconductance of a $j^{th}$ transistor of the $n^{th}$ stage, and $V_{(n-j)}$ is a voltage of a $(n-j)^{th}$ output node of the plurality of output nodes.

29. The oscillator of claim 27, wherein a frequency of a fundamental mode, when N is even, is substantially equal to $$\frac{2(1-a)}{N\tan\left(\frac{\pi}{N}\right)}\omega_T,$$

and when N is odd, is substantially equal to $$\omega_T\left(\frac{1-a}{N\tan\left(\frac{\pi}{2N}\right)} + \frac{a}{N}\tan\left(\frac{\pi}{n}\right)\right),$$

wherein a normalized frequency parameter $\omega_T$ is proportional to a total transconductance per stage $g_T$ and inversely proportional to the capacitance C ($\omega_T = g_T/C$), and a relative attenuation parameter a is proportional to an attenuation $\alpha$ of undesired modes and inversely proportional to the frequency parameter $\omega_T$ (a=$\alpha/\omega_T$).

30. The oscillator of claim 27, wherein a frequency for the fundamental oscillation mode is substantially equal to $$-\omega_T \sum_{n=1}^{N-1} G_n \sin\frac{2\pi n}{N},$$

wherein "n" is a summation index, a normalized frequency parameter $\omega_T$ is proportional to a total transconductance per stage $g_T$ and inversely proportional to the capacitance C($\omega_T = g_T/C$), and a normalized transconductance $G_n$ is directly proportional to a transconductance $g_n$ of a $n^{th}$ transistor of the plurality of input transistors and inversely proportional to a total transconductance $g_T$ of each stage of the plurality of stages ($G_n = g_n/g_T$).

31. The oscillator of claim 27, wherein the plurality of inverting gain stages provide a corresponding plurality of output signals having a fundamental mode of oscillation at a selected frequency, with each output signal differing from the other output signals with respect to a phase difference of integer multiples of $2\pi/N$.

* * * * *